United States Patent
Kim

(10) Patent No.: US 10,909,904 B2
(45) Date of Patent: Feb. 2, 2021

(54) ORGANIC LIGHT EMITTING DISPLAY DEVICE

(71) Applicant: LG Display Co., Ltd., Seoul (KR)

(72) Inventor: YuHoon Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 148 days.

(21) Appl. No.: 15/371,099

(22) Filed: Dec. 6, 2016

(65) Prior Publication Data
US 2017/0294155 A1    Oct. 12, 2017

(30) Foreign Application Priority Data

Apr. 8, 2016 (KR) .................. 10-2016-0043732
Jul. 29, 2016 (KR) .................. 10-2016-0097304

(51) Int. Cl.
*G09G 3/20* (2006.01)
*H01L 27/32* (2006.01)
(Continued)

(52) U.S. Cl.
CPC ......... *G09G 3/2074* (2013.01); *G09G 3/2003* (2013.01); *G09G 3/3225* (2013.01); *G09G 3/3266* (2013.01); *H01L 27/3218* (2013.01); *H01L 27/3248* (2013.01); *H01L 27/3262* (2013.01); *H01L 27/3276* (2013.01); *G09G 2300/0443* (2013.01);
(Continued)

(58) Field of Classification Search
None
See application file for complete search history.

(56) References Cited

U.S. PATENT DOCUMENTS 6,768,482 B2  7/2004  Asano et al.
7,417,648 B2  8/2008  Credelle
(Continued)

FOREIGN PATENT DOCUMENTS

CN  103777405 A  5/2014
CN  104037202 A  9/2014
(Continued)

OTHER PUBLICATIONS

European Office Action for European Application No. 17 160 272 5 dated Nov. 25, 2020.

*Primary Examiner* — Brian M Butcher
(74) *Attorney, Agent, or Firm* — Birch, Stewart, Kolasch & Birch LLP

(57) ABSTRACT

An organic light emitting display device including a plurality of pixels is provided according to an embodiment. Each of the plurality of pixels includes three sub pixels. The plurality of pixels include a first pixel having a green sub pixel and two red sub pixels, a second pixel having a green sub pixel and two blue sub pixels, the second pixel being adjacent to the first pixel in a first direction, a third pixel having a green sub pixel and two blue sub pixels, the third pixel being adjacent to the first pixel in a second direction, and a fourth pixel having a green sub pixel and two red sub pixels, the fourth pixel being adjacent to the second pixel in the second direction. In the organic light emitting display device according to an example embodiment of the present disclosure, sub pixels are asymmetrically disposed in pixels which are disposed in at least one direction, to reduce lattice artifact by the regular arrangement of the sub pixels.

24 Claims, 19 Drawing Sheets

(51) Int. Cl.
*G09G 3/3225* (2016.01)
*G09G 3/3266* (2016.01)

(52) U.S. Cl.
CPC .............. *G09G 2300/0452* (2013.01); *G09G 2300/0809* (2013.01); *G09G 2310/0291* (2013.01); *G09G 2320/0646* (2013.01); *G09G 2320/0666* (2013.01); *G09G 2340/0457* (2013.01)

(56) References Cited

U.S. PATENT DOCUMENTS

| | | | |
|---|---|---|---|
| 7,443,093 | B2 | 10/2008 | Jianpu et al. |
| 8,159,117 | B2 | 4/2012 | Karaki et al. |
| 8,253,323 | B2 | 8/2012 | Sung et al. |
| 8,330,352 | B2 | 12/2012 | Sung et al. |
| 8,338,832 | B2 | 12/2012 | Kim |
| 8,552,635 | B2 | 10/2013 | Kim et al. |
| 8,716,929 | B2 | 5/2014 | Yoo et al. |
| 8,754,913 | B2 | 6/2014 | Hwang et al. |
| 8,994,015 | B2 | 3/2015 | Pyon et al. |
| 9,041,625 | B2 | 5/2015 | Hwang et al. |
| 9,307,584 | B2 | 4/2016 | Ko |
| 9,318,537 | B2 | 4/2016 | Sung et al. |
| 9,324,262 | B2 | 4/2016 | Kim et al. |
| 2005/0110398 | A1 | 5/2005 | Lee |
| 2006/0027819 | A1 | 2/2006 | Hu |
| 2008/0231577 | A1* | 9/2008 | Lin ............... G09G 3/3607 345/90 |
| 2010/0039011 | A1 | 2/2010 | Karaki et al. |
| 2011/0025723 | A1 | 2/2011 | Kim |
| 2013/0234917 | A1 | 9/2013 | Lee |
| 2014/0071030 | A1 | 3/2014 | Lee |
| 2015/0015466 | A1 | 1/2015 | Feng |
| 2015/0144925 | A1 | 5/2015 | Baek et al. |
| 2015/0161935 | A1* | 6/2015 | Giannikouris ....... G09G 3/2074 345/694 |
| 2015/0364525 | A1 | 12/2015 | Lin et al. |
| 2015/0364526 | A1 | 12/2015 | Peng et al. |
| 2016/0057817 | A9 | 2/2016 | Ko |
| 2016/0197123 | A1 | 7/2016 | Sung et al. |
| 2016/0197125 | A1 | 7/2016 | Ko |

FOREIGN PATENT DOCUMENTS

| | | |
|---|---|---|
| CN | 104680972 A | 6/2015 |
| CN | 105261635 A | 1/2016 |
| CN | 104465712 A | 3/2016 |
| CN | 104599599 A | 5/2016 |
| JP | 2008-209902 A | 9/2008 |
| JP | 2012-28170 A | 2/2012 |
| KR | 10-0560789 B1 | 3/2006 |
| KR | 10-0729077 B1 | 6/2007 |
| KR | 10-2008-0035774 A | 4/2008 |
| KR | 10-2009-0049515 A | 5/2009 |
| KR | 10-2010-0001598 A | 1/2010 |
| KR | 10-2011-0013691 A | 2/2011 |
| KR | 10-1066411 B1 | 9/2011 |
| KR | 10-2011-0117612 A | 10/2011 |
| KR | 10-2011-0117613 A | 10/2011 |
| KR | 10-2011-0129531 A | 12/2011 |
| KR | 10-2013-0025741 A | 3/2013 |
| KR | 10-2013-0101874 A | 9/2013 |
| KR | 10-2014-0020120 A | 2/2014 |
| KR | 10-2014-0111505 A | 9/2014 |
| KR | 10-2015-0007261 A | 1/2015 |
| KR | 10-2015-0007992 A | 1/2015 |
| KR | 10-2015-0107883 A | 9/2015 |
| KR | 10-2015-0122564 A | 11/2015 |
| KR | 10-2016-0018936 A | 2/2016 |
| KR | 10-2016-0019243 A | 2/2016 |
| KR | 10-2016-0029376 A | 3/2016 |
| WO | 10-2012-0020087 A | 3/2012 |
| WO | WO 2012/157536 A1 | 11/2012 |
| WO | 10-2013-0007309 A | 1/2013 |

\* cited by examiner

|  | AVERAGE | DEVIATION |
|---|---|---|
| COMPARATIVE EMBODIMENT | 84.4 | 69.4 |
| FIRST EXEMPLARY EMBODIMENT | 80.8 | 44.5 |
| SECOND EXEMPLARY EMBODIMENT | 82.1 | 21.2 |

FIG. 19

ORGANIC LIGHT EMITTING DISPLAY DEVICE

CROSS-REFERENCE TO RELATED APPLICATIONS

This application claims priority from and the benefit under 35 U.S.C. § 119(a) of the Korean Patent Application No. 10-2016-0097304, filed on Jul. 29, 2016, and No. 10-2016-043732, filed on Apr. 8, 2016, all of which are hereby incorporated by reference as if fully set forth herein.

BACKGROUND

Field of the Disclosure

The present disclosure relates to an organic light emitting display device and more particularly, to an organic light emitting display device with an improved image quality.

Description of the Related Art

Recently, as the society advances to the information society, the field of display devices which visually express electrical information signals is rapidly advancing. In accordance with the rapid development, various display devices having excellent performance with thinner thickness, lighter weight, and low power consumption characteristics have been developed.

Specific examples of the above-mentioned display device may include a liquid crystal display device (LCD), a plasma display panel device (PDP), a field emission display device (FED), and an organic light emitting display device (OLED).

Specifically, the organic light emitting display device is a self-emitting display device and has advantages such as a high response time, high luminous efficiency, high brightness, and a wide viewing angle compared to other display devices. Therefore the organic light emitting display device is attracting much attention.

Further, an organic light emitting diode which is applied to the organic light emitting display device is a next-generation light source having a self-emitting property and has excellent advantages in terms of viewing angle, contrast, response time, and power consumption, as compared to the liquid crystal. Further, the organic light emitting display device has a surface emission structure so that it is easy to implement a flexible device.

The organic light emitting display device includes a plurality of pixels and each of the pixels includes a red sub pixel, a green sub pixel, and a blue sub pixel. The red sub pixel, the green sub pixel, and the blue sub pixel emit red light, green light, and blue light, respectively, and a full color image may be provided through the plurality of sub pixels. Here, the plurality of pixels include an emission area in which red, green, or blue light is emitted and a non-emission area in which red, green, or blue light is not emitted.

In order to dispose an organic light emitting layer in each of the red sub pixel, the green sub pixel, and the blue sub pixel, a certain predetermined process margin is required between organic light emitting layers. If the organic light emitting layer is not disposed as required by the process margin or as a bank layer which defines a pixel is disposed, a non-emission area may be provided between the emission areas.

Recently, as the organic light emitting display device is developed to have a small size and a high resolution, a size of one pixel is reduced. Even though the size of the pixel is reduced, the process margin is necessary. Therefore, the non-emission area corresponding to the process margin cannot be significantly reduced. Therefore, there may be a problem in that a black lattice shape is visibly recognized between the emission areas as the ratio of the non-emission area in one pixel is increased. An example of pixel array structure and organic light emitting display including the same is discussed in Korean Patent Publication No. 2014-0020120 (U.S. Pat. No. 9,324,262).

SUMMARY

Inventor of the present disclosure recognized that if one sub pixel is separated in the organic light emitting display device to minimize the black lattice shape visibly recognized at the same aperture ratio, a fill factor can be improved. Therefore, the inventor invented an organic light emitting display device which improves a fill factor which is substantially recognized and has an improved image quality while maintaining or increasing the aperture ratio.

Therefore, an object to be achieved by the present disclosure is to provide an organic light emitting display device which disposes a sub pixel to be separated into two while maintaining an area of the sub pixel in one pixel, to improve a cognitive fill factor which is substantially recognized by a user and improve an image quality.

Another object to be achieved by the present disclosure is to provide an organic light emitting display device in which two separated sub pixels are connected to one driving transistor to simultaneously drive the two separated sub pixels, thereby reducing a lattice artifact which may be visually recognized between the sub pixels.

Another object to be achieved by the present disclosure is to provide an organic light emitting display device which disposes two separated sub pixels in different adjacent pixels and drives the sub pixels which are arranged in adjacent pixels using one driving transistor, to improve a cognitive fill factor.

Objects of the present disclosure are not limited to the above-mentioned objects, and other objects, which are not mentioned above, can be clearly understood by those skilled in the art from the following descriptions.

According to an aspect of the present disclosure, there is provided an organic light emitting display device including a plurality of pixels. Each of the plurality of pixels includes three sub pixels. The plurality of pixels include a first pixel having a green sub pixel and two red sub pixels, a second pixel having a green sub pixel and two blue sub pixels, the second pixel being adjacent to the first pixel in a first direction, a third pixel having a green sub pixel and two blue sub pixels, and the third pixel being adjacent to the first pixel in a second direction, and a fourth pixel having a green sub pixel and two red sub pixels, and the fourth pixel being adjacent to the second pixel in the second direction. In the organic light emitting display device according to the example embodiment of the present disclosure, sub pixels are asymmetrically arranged in pixels which are arranged in one direction, to reduce lattice artifact due to regular arrangement of the sub pixels.

According to another aspect of the present disclosure, there is provided an organic light emitting display device including a plurality of pixels. Each of the plurality of pixels includes a green sub pixel, a red sub pixel, and a blue sub pixel. The plurality of pixels include a first pixel, a second pixel being adjacent to the first pixel in a first direction, a third pixel being adjacent to the first pixel in a second direction, and a fourth pixel being adjacent to the second pixel in the second direction. Each of the plurality of pixels includes two driving transistors which control each sub pixel to emit light. In the organic light emitting display device according to the example embodiment of the present disclosure, sub pixels are arranged to be separated in one pixel and the separated sub pixels are driven by one driving transistor. Therefore, there are effects that the spacing between sub pixels which are recognized by the user is reduced and a cognitive fill factor of the organic light emitting display device is improved.

According to another aspect of the present disclosure, an organic light emitting display device includes first and fourth pixels each including one green sub pixel and two red sub pixels, and second and third pixels each including one green sub pixel and two blue sub pixels. The second pixel is adjacent to the first pixel in a first direction, and the third pixel is adjacent to the first pixel in a second direction different from the first direction and the first to fourth pixels adjacent to each other are repeatedly arranged over a substrate in the first and second directions, respectively. Each pixel including three sub pixels is driven by two driving transistors.

Other specifics of the embodiments are included in the detailed description and the drawings.

According to the present disclosure, sub pixels are asymmetrically arranged in pixels which are arranged in at least one direction, to reduce lattice artifact due to the regular arrangement of the sub pixels.

According to the present disclosure, sub pixels are asymmetrically arranged in pixels which are arranged in at least one direction, to reduce lattice artifact due to the regular arrangement of the sub pixels. Accordingly, an organic light emitting display device with an improved image quality can be provided.

According to the present disclosure, sub pixels are arranged to be separated in one pixel and the separated sub pixels are driven by one driving transistor. Therefore, the spacing between sub pixels which are recognized by the user is reduced and a cognitive fill factor of the organic light emitting display device may be improved.

According to the present disclosure, the sub pixels are asymmetrically arranged in the pixels which are arranged in at least one direction. Therefore, the stress at the time when the fine metal mask (FMM) is pulled may be uniformly distributed in the aperture area of the FMM during a deposition process using the FMM and the deformation of the FMM may be minimized. Therefore, the precision of the deposition of the organic light emitting layer may be improved.

According to the present disclosure, even though the sub pixels are partially regularly arranged, sub pixels which emit same color light are arranged to be sufficiently spaced apart from each other. Therefore, the stress which is applied to the aperture area of the FMM may be distributed and the deformation of the FMM may be minimized. Therefore, the precision of the deposition of the organic light emitting layer may be improved. Further, since the deformation of the FMM is minimized, the problem that the organic light emitting layers which are deposited through the FMM overlap may be reduced.

The effects according to the present disclosure are not limited to the contents exemplified above, and more various effects are included in the present specification. Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The above and other aspects, features and other advantages of the present disclosure will be more clearly understood from the following detailed description taken in conjunction with the accompanying drawings, in which:

FIG. 19 is a table including numerical values representing an effect according to a comparative embodiment and example embodiments of the present disclosure.

DETAILED DESCRIPTION OF THE EMBODIMENTS

Figure 1:
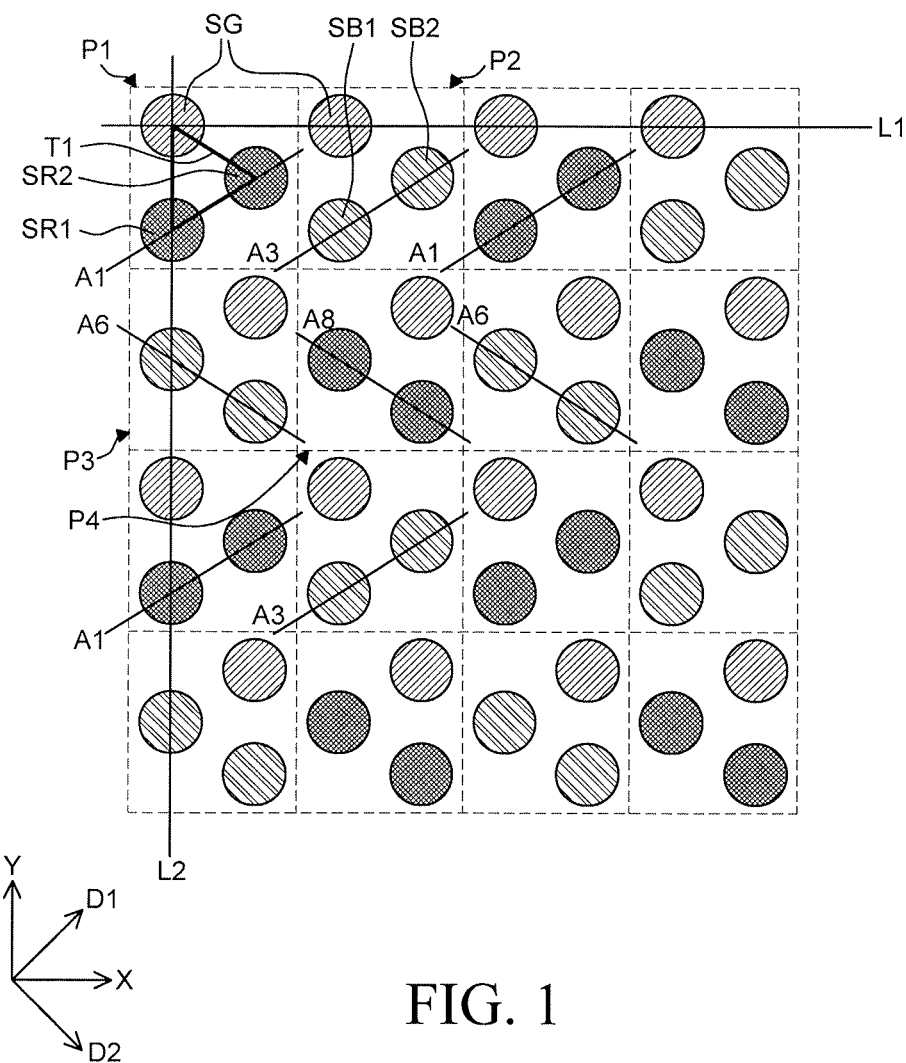
FIG. 1 is a schematic plan view illustrating an organic light emitting display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to example embodiment disclosed herein but will be implemented in various forms. The example embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Same reference numerals generally denote same elements throughout the specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" other element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways, and the embodiments can be carried out independently of or in association with each other.

Hereinafter, various example embodiments of the present disclosure will be described in detail with reference to accompanying drawings.

FIG. 1 is a schematic plan view illustrating an organic light emitting display device according to an example embodiment of the present disclosure.

Referring to FIG. 1, an organic light emitting display device 100 includes a plurality of pixels and each of the plurality of pixels includes a plurality of sub pixels. In detail, each of the plurality of pixels includes three sub pixels. The plurality of sub pixels include a red sub pixel SR, a green sub pixel SG, and a blue sub pixel SB and emits red light, green light, and blue light. However, the sub pixels of the organic light emitting display device 100 is not limited thereto and the organic light emitting display device 100 may further include a white sub pixel in addition to the red sub pixel SR, the green sub pixel SG, and the blue sub pixel SB.

Referring to FIG. 1, a D1 direction and a D2 direction are not parallel to an x-axis direction and a y-axis direction and the D1 direction and the D2 direction are set to have arbitrary angles excluding 0° or 180° with respect to the x-axis direction and the y-axis direction. That is, two red sub pixels SR1 and SR2 and two blue sub pixels SB1 and SB2 may be disposed in one pixel to have arbitrary angles which do not overlap the x-axis direction and the y-axis direction. In this specification, the x-axis direction, the y-axis direction, the D1 direction, and the D2 direction may be referred to as a first direction, a second direction, a third direction, and a fourth direction, respectively. Each of the first to fourth directions includes not only one direction illustrated in the drawing but also an opposite direction thereto.

Further, in FIG. 1, a first straight line L1 which is one of straight lines parallel to the first direction and a second straight line L2 which is one of straight lines parallel to the second direction are illustrated. However, the first straight line L1 and the second straight line L2 are illustrated as examples of straight lines parallel to the first direction and the second direction, but are not limited to the straight line illustrated in FIG. 1.

Similarly, in FIG. 1, a first diagonal line A1 and a third diagonal line A3 are illustrates as diagonal lines extending in the third direction, and a sixth diagonal line A6 and an eighth diagonal line A8 are illustrates as diagonal lines extending in the fourth direction. As described above, the first diagonal line A1 and the third diagonal line A3 are represented to distinguish various diagonal lines parallel to the third direction in each of the plurality of pixels, but are not limited to the numbers denoting the diagonal lines. However, diagonal lines which are denoted by odd numbers may indicate the same direction. Similarly, the sixth diagonal line A6 and the eighth diagonal line A8 are represented to distinguish various diagonal lines parallel to the fourth direction in each of the plurality of pixels, but are not limited to the numbers denoting the diagonal lines. However, diagonal lines which are denoted by even numbers may indicate the same direction.

Hereinafter, it may be understood that the straight lines and the diagonal lines used in the specification are represented for the same purpose as the above.

The plurality of pixels include a first pixel P1, a second pixel P2 which is adjacent to the first pixel P1 in the first direction, a third pixel P3 which is adjacent to the first pixel P1 in the second direction, and a fourth pixel P4 which is adjacent to the second pixel P2 in the second direction.

Referring to FIG. 1, the first pixel P1 includes a green sub pixel SG and two red sub pixels SR1 and SR2. The second pixel P2 includes a green sub pixel SG and two blue sub pixels SB1 and SB2. The third sub pixel P3 includes a green sub pixel SG and two blue sub pixels SB1 and SB2. The fourth sub pixel P4 includes a green sub pixel SG and two red sub pixels SR1 and SR2. Hereinafter, for the convenience of description, the first pixel P1 or the second pixel P2 will be referred to as a reference pixel according to an example embodiment.

Referring to FIG. 1, one pixel includes one green sub pixel SG and further includes two red sub pixels SR1 and SR2 or two blue sub pixels SB1 and SB2.

As shown in FIG. 1, at least one sub pixel among the green sub pixel SG, one red sub pixel between two red sub pixels SR1 and SR2, and one blue sub pixel between two blue sub pixels SB1 and SB2 is not disposed on the same straight line. And, the first pixel P1 and the second pixel P2 are adjacent in a row direction and the green sub pixels SG of the first pixel P1 and the second pixel P2 are disposed on the same straight line in the row direction. Here, the row direction may be the first direction. And, the first pixel P1 and the fourth pixel P4 are asymmetrical to each other and the second pixel P2 and the third pixel P3 are asymmetrical to each other.

In detail, the green sub pixel SG of the first pixel P1 and the green sub pixel SG of the second pixel P2 are disposed on a first straight line L1 extending in the first direction and a straight line connecting a center of the green sub pixel SG of the first pixel P1 and a center of the green sub pixel SG of the third pixel P3 intersects a second straight line L2 extending in the second direction. Two red sub pixels SR1 and SR2 of the first pixel P1 are disposed on a first diagonal line A1 extending in a third direction and two blue sub pixels SB1 and SB2 of the second pixel P2 are disposed on a third diagonal line A3 extending in the third direction. Two blue sub pixels SB1 and SB2 of the third pixel P3 are disposed on the sixth diagonal line A6 extending in the fourth direction and two red sub pixels SR1 and SR2 of the fourth pixel P4 are disposed in the eighth diagonal line A8 extending in the fourth direction.

In detail, when two red sub pixels SR1 and SR2 are disposed in one pixel, a first red sub pixel SR1 of two red sub pixels SR1 and SR2 may be disposed on a same straight line in the y-axis direction with the green sub pixel SG, and the second red sub pixel SR2 may be disposed on a diagonal line which is the D2 direction with respect to the green sub pixel SG Further, the second red sub pixel SR2 may be disposed on a same straight line in the y-axis direction with the green sub pixel SG In this instance, the first red sub pixel SR1 may be disposed on the diagonal line which is the D1 direction with respect to the green sub pixel SG.

Similarly, when two blue sub pixels SB1 and SB2 are disposed in one pixel, a first blue sub pixel SB1 of two blue sub pixels SB1 and SB2 may be disposed on a same straight line in the y-axis direction with the green sub pixel SG, and the second blue sub pixel SB2 may be disposed in a diagonal line which is the D2 direction with respect to the green sub pixel SG. Further, the second blue sub pixel SB2 may be disposed on a same straight line in the y-axis direction with the green sub pixel SG. In this instance, the first blue sub pixel SB1 may be disposed on the diagonal line which is the D1 direction with respect to the green sub pixel SG That is, straight lines connecting centers of three sub pixels in each of the plurality of pixels form a triangle T1.

When two red sub pixels SR1 and SR2 are disposed on the first diagonal line A1 which is the D1 direction in the first pixel P1 which is one reference pixel, two blue sub pixels SB1 and SB2 are disposed on the sixth diagonal line A6 which is the D2 direction in a pixel adjacent to the reference pixel in the y-axis direction. Further, when two blue sub pixels SB1 and SB2 are disposed on the third diagonal line A3 which is the D1 direction in the second pixel P2 which is one reference pixel, two red sub pixels SR1 and SR2 are disposed on the eighth diagonal line A8 which is the D2 direction in a pixel adjacent to the reference pixel in the y-axis direction.

And, when two red sub pixels SR1 and SR2 are disposed on the eighth diagonal line A8 which is the D2 direction in one reference pixel, two blue sub pixels SB1 and SB2 are disposed on the third diagonal line A3 which is the D1 direction in a pixel adjacent to the reference pixel in the y-axis direction. Furthermore, when two blue sub pixels SB1 and SB2 are disposed on the sixth diagonal line A6 which is the D2 direction in the one reference pixel, two red sub pixels SR1 and SR2 are disposed on the first diagonal line A1 which is the D1 direction in a pixel adjacent to the reference pixel in the y-axis direction.

Further, when two red sub pixels SR1 and SR2 are disposed on the first diagonal line A1 which is the D1 direction in the first pixel P1 which is one reference pixel, two blue sub pixels SB1 and SB2 are disposed on the third diagonal line A3 which is the D1 direction in a pixel adjacent to the reference pixel in the x-axis direction. Similarly, when two blue sub pixels SB1 and SB2 are disposed in the third diagonal line A3 which is the D1 direction in the second pixel P2 which is one reference pixel, two red sub pixels SR1 and SR2 are disposed on the first diagonal line A1 which is the D1 direction in a pixel adjacent to the reference pixel in the x-axis direction.

Therefore, in the organic light emitting display device 100 of the present disclosure, the plurality of sub pixels are disposed in the order of red-red-green-red-blue-green-blue-blue-green-blue-red-green in the D1 direction or the D2 direction. That is, in the organic light emitting display device 100, 12 sub pixels which are arranged in the D1 direction or the D2 direction are irregularly and asymmetrically arranged. Therefore, in the organic light emitting display device 100, a lattice artifact may be significantly reduced by irregularly and asymmetrically arranging the sub pixels.

Here, the lattice artifact refers to an artifact which is visibly recognized as a black lattice when the pixel emits light by a bank layer between the sub pixels.

Figure 2:
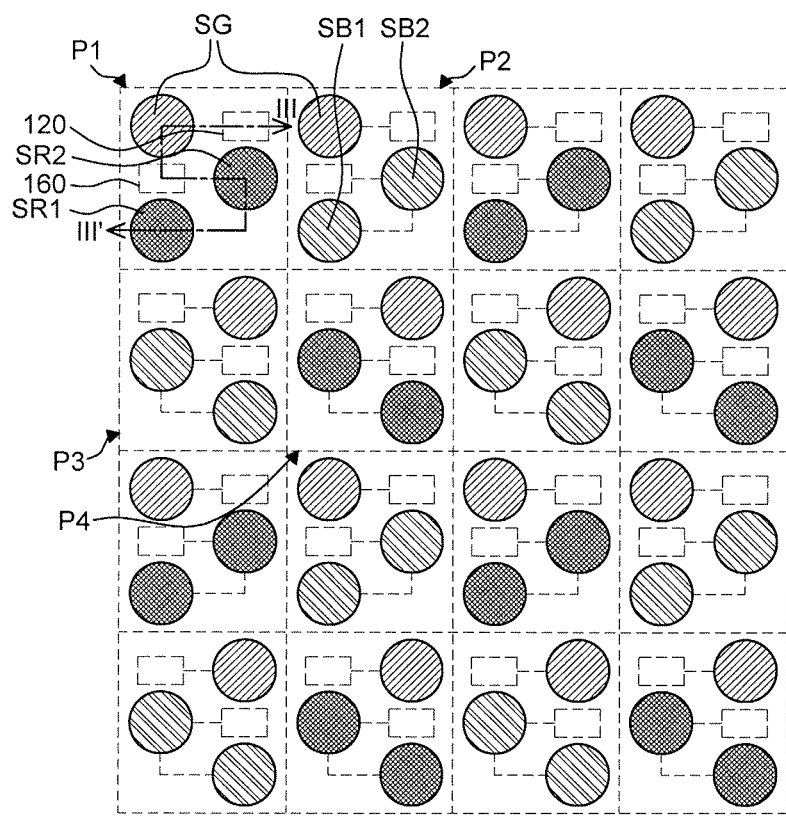
FIG. 2 is a plan view illustrating an organic light emitting display device according to an example embodiment of the present disclosure which is in more detail than FIG. 1.
Figure 3:
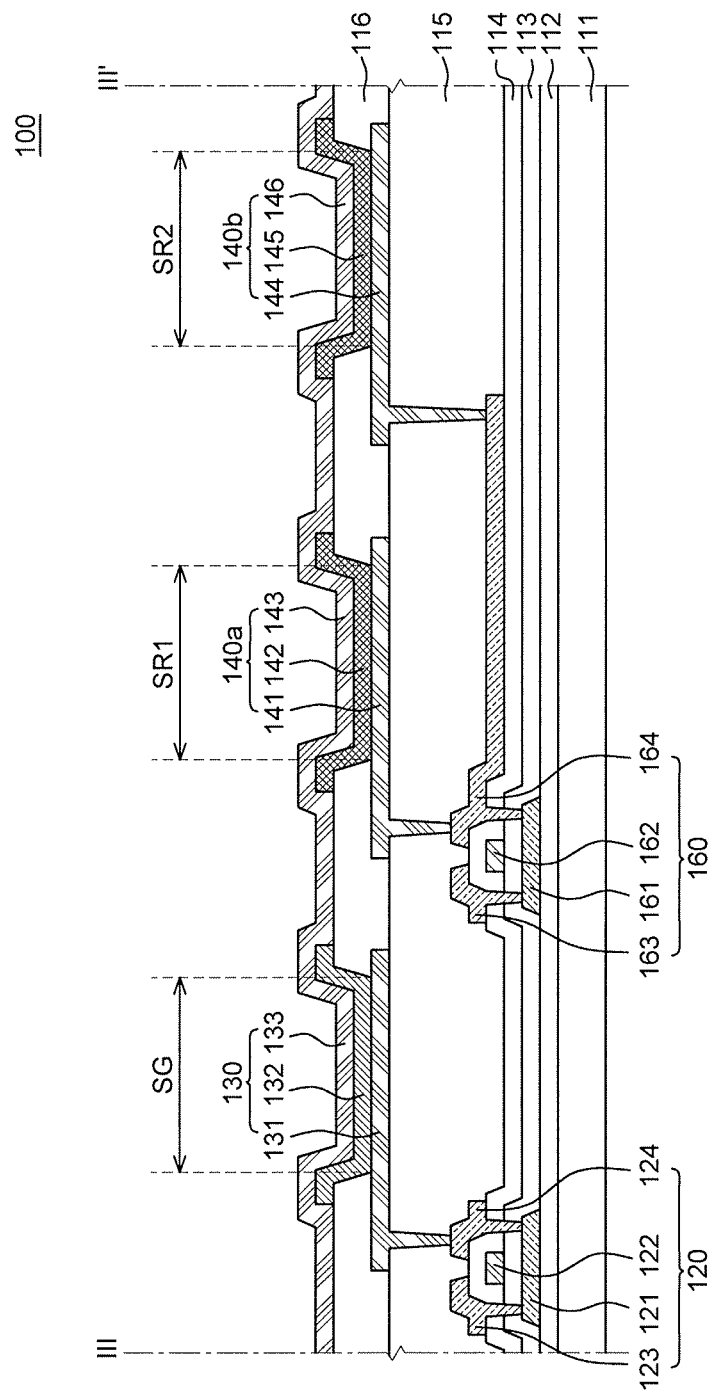
FIG. 3 is a schematic cross-sectional view taken along III-III' of FIG. 2 illustrating an organic light emitting display device according to an example embodiment of the present disclosure.

FIG. 2 is a plan view illustrating an organic light emitting display device according to an example embodiment of the present disclosure which is more detailed than FIG. 1. FIG. 3 is a schematic cross-sectional view taken along III-III' of FIG. 2 illustrating an organic light emitting display device according to an example embodiment of the present disclosure. In FIG. 2, only a sub pixel and a driving transistor of the organic light emitting display device are schematically illustrated but other detailed components of the organic light emitting display device 100 are not illustrated.

Referring to FIG. 2, one pixel includes a first driving transistor 120 and a second driving transistor 160. That is, each of the plurality of pixels includes at least two driving transistors 120 and 160 which control each of the sub pixels to emit light. At least two driving transistors 120 and 160 include a first driving transistor 120 which is connected to the green sub pixel SG and a second driving transistor 160 which is connected to two red sub pixels SR1 and SR2 or two blue sub pixels SB1 and SB2 to simultaneously emit light. In detail, in one pixel, the first driving transistor 120 is connected to the green sub pixel SG and the second driving transistor 160 is connected to a first red sub pixel SR1 and a second red sub pixel SR2. A connection relationship of the green sub pixel SG and the first driving transistor 120 and a connection relationship of the first red sub pixel SR1 and the second red sub pixel SR2 and the second driving transistor 160 will be described with reference to FIG. 3.

For the convenience of description, the configuration of the organic light emitting diode 130 and the first driving transistor 120 will be described with respect to the green sub pixel SG, and any duplicate explanations regarding a configuration of the corresponding organic light emitting diodes 140a and 140b and second driving transistor 160 of the two red sub pixels SR1 and SR2 will be omitted and will be briefly made below.

Referring to FIG. 3, a substrate 111 serves to support and protect several components of the organic light emitting display device 100. The substrate 111 may be formed of an insulating material. For example, the substrate 100 may be formed of a glass or a flexible material such as a polyimide based material. When the organic light emitting display device 100 is a flexible organic light emitting display device 100, the organic light emitting display device may be formed of a flexible material such as plastic. When the organic light emitting device which may easily implement flexibility is applied to an illumination device for a vehicle or an automotive display device for a vehicle, various designs and a degree of freedom of a design of the illumination device for a vehicle and the display device for a vehicle may be secured according to a structure or an exterior shape of the vehicle.

The organic light emitting display device 100 according to several example embodiments may be applied to various display devices including a TV, a mobile phone, a tablet PC, a monitor, a laptop computer, and a display device for a vehicle or an automotive display device. Further, the organic light emitting display device 100 according to several example embodiments may also be applied to a wearable display device, a foldable display device, and a rollable or a bendable display device.

A buffer layer 112 is disposed on the substrate 111. The buffer layer 112 may suppress moisture or impurities from permeating through the substrate 111 and planarize an upper portion of the substrate 111. However, the buffer layer 112 is not an essential component. It is determined whether to form the buffer layer 112 is based on a type of the substrate 111 or a type of the first driving transistor 120 which is applied to the organic light emitting display device 100.

The first driving transistor 120 is disposed on the buffer layer 112 and supplies a signal to a green organic light emitting diode 130. The first driving transistor 120 includes an active layer 121, a gate electrode 122, a source electrode 123, and a drain electrode 124. In detail, the active layer 121 is formed on the buffer layer 112 and a gate insulating layer 113 which insulates the active layer 121 from the gate electrode 122 is formed on the active layer 121. Further, the gate electrode 122 is formed on the gate insulating layer 113 to overlap the active layer 121 and an interlayer insulating layer 114 is formed on the gate electrode 122 and the gate insulating layer 113. The source electrode 123 and the drain electrode 124 are formed on the interlayer insulating layer 114. The source electrode 123 and the drain electrode 124 are electrically connected to the active layer 121.

And, the active layer 121 may be formed of amorphous silicon (a-Si), polycrystalline silicon (poly-Si), an oxide semiconductor, or an organic semiconductor. When the active layer 121 is formed of an oxide semiconductor, the active layer 121 may be formed of indium tin oxide (ITO), indium zinc oxide (IZO), indium gallium zinc oxide (IGZO), or indium tin zinc oxide (ITZO), but is not limited thereto. When the active layer 121 is formed of IGZO, a ratio of In:Ga:Zn may be 1:2:1. In this instance, in the active layer 121, a Ga rich layer may be formed on a top surface of the IGZO layer. The Ga-rich layer may reduce a positive bias temperature stress (PBTS), so that reliability of the organic light emitting display device can be improved.

For the convenience of description, in FIG. 3, only a driving transistor which is connected to an anode 131 of the green sub pixel, among various driving transistors which may be included in the green sub pixel SG is illustrated. However, the green sub pixel SG may further include a switching driving transistor or a capacitor which drives the green organic light emitting diode 130. Further, even though in the present disclosure, it is described that the first driving transistor 120 has a coplanar structure, an inverted staggered structure for the first driving transistor 120 may also be applied. Further, in the drawing, a structure in which an anode of the organic light emitting diode is connected to the drain electrode 124 of the first driving transistor 120 is illustrated. However, in some designs, the anode of the green organic light emitting diode 130 may be connected to the source electrode 123 of the first driving transistor 120.

A planarizing layer 115 is disposed on the first driving transistor 120. The planarizing layer 115 is a layer which planarize an upper portion of the substrate 111 and may be formed of an organic insulating layer to cover a step portion of the upper portion of the substrate 111. The planarizing layer 115 includes a contact hole which electrically connects the anode 131 of the green sub pixel SG to the drain electrode 124 of the first driving transistor 120 and a contact hole which electrically connects an anode 141 of the first red sub pixel SR1 and an anode 144 of the second red sub pixel SR2 to a drain electrode 164 of the second driving transistor 160.

The drain electrode 164 of the second driving transistor 160 may be disposed on the interlayer insulating layer 114 to extend in one direction. In detail, the drain electrode 164 may be disposed on the interlayer insulating layer 114 to extend from the second driving transistor 160 so as to be connected to the anode 144 of the second red sub pixel SR2. Therefore, both the anode 141 of the first red sub pixel SR1 and the anode 144 of the second red sub pixel SR2 are connected to the drain electrode 164 of the second driving transistor 160. A first red organic light emitting diode 140a and a second red organic light emitting diode 140b may simultaneously emit light by a driving voltage which is supplied by the second driving transistor 160.

In FIG. 3, a configuration that the drain electrode 164 is disposed on the interlayer insulating layer 114 to be connected to the anode 141 of the first red sub pixel SR1 and the anode 144 of the second red sub pixel SR2 is illustrated. However, according to an example embodiment, the first red organic light emitting diode 140a and the second red organic light emitting diode 140b may be connected to one second driving transistor 160 by various methods, so as to simultaneously emit light. Another method which connects the first red organic light emitting diode 140a and the second red organic light emitting diode 140b to the second driving transistor 160 will be described later with reference to FIG. 4.

The green organic light emitting diode 130 is disposed on the planarizing layer 115 and includes an anode 131, an organic light emitting layer 132, and a cathode 133.

The anode 131 is an electrode which supplies holes to the organic light emitting layer 132 and may be configured by a transparent conductive material having a high work function. Here, the transparent conductive material may include indium tin oxide (ITO), indium zinc oxide (IZO), or indium tin zinc oxide (ITZO). As illustrated in FIG. 3, when the organic light emitting display device 100 is driven by a top emission method, the anode 131 may further include a reflector. Here, the anode 131 may also be referred to as a pixel electrode.

The cathode 133 is an electrode which supplies electrons. The cathode 133 may be configured by a metallic material having a relatively low work function, for example, silver (Ag), titanium (Ti), aluminum (Al), molybdenum (Mo), an alloy (Ag:Mg) of silver (Ag) and magnesium (Mg), or magnesium (Mg) and lithium fluoride (Mg:LiF). The cathode 130 may be configured by at least two or more layers. Here, the cathode 133 may also be referred to as a common electrode. When the cathode 133 is configured by the alloy (Ag:Mg) of silver (Ag) and magnesium (Mg), a content of silver (Ag) is adjusted to be higher than a content of magnesium (Mg) to reduce a resistance of the cathode 133. In this instancein order to suppress Ag from being oxidized so that the resistance is lowered, a ytterbium (Yb) layer may be disposed above, below, or above and below the Ag:Mg layer.

Each of the organic light emitting diode includes an organic light emitting layer. In detail, the organic light emitting layer is disposed between the anode and the cathode. For example, in the green organic light emitting diode 130, the green organic light emitting layer 132 is disposed between the anode 131 and the cathode 133.

The organic light-emitting display device 100 may have a patterned emission layer structure in accordance with a design. The organic light emitting display device having a patterned emission layer structure has a structure in which light emitting layers which emit different color light are separated for every pixel. For example, red organic light emitting layers 142 and 145 emitting red light, a green organic light emitting layer 132 emitting green light, and a blue organic light emitting layer emitting blue light are separately disposed in a red sub pixel SR, a green sub pixel SG, and a blue sub pixel SB, respectively. In each of the red organic light emitting layers 142 and 145, the green organic light emitting layer 132, and the blue organic light emitting layer, holes and electrons which are supplied through the anodes 131, 141, and 144 and the cathodes 133, 143, and 146 are coupled to each other to emit red light, green light, and blue light. Each of the organic light emitting layers may be patterned and deposited on a predetermined sub pixel through an apertured mask, for example, a fine metal mask (FMM), to emit specific color light.

The red organic light emitting layers, the green organic light emitting layer, and the blue organic light emitting layer include at least one light emitting host and a light emitting dopant. The at least one light emitting host may be configured by a mixed host in which a hole type host and an electron type host are mixed. When the light emitting host is configured by the mixed host, the coupling of the hole and the electron in the organic light emitting layer is improved so that a life-span of the organic light emitting layer can be improved.

The wavelength of the light emitted from the red organic light emitting layer is in the range from 600 nm to 650 nm, and the wavelength of the light emitted from the green organic light emitting layer is in the range from 510 nm to 590 nm. And, the wavelength of the light emitted from the blue organic light emitting layer is in the range from 440 nm to 480 nm.

In addition to the organic light emitting layer, common layers such as an injection layer or a transporting layer may be further disposed between the anode 131 and the cathode 133 to improve luminous efficiency of the organic light emitting diode. At least some common layers among the common layers may have a common structure to be commonly disposed in a plurality of sub pixels, in order to achieve an advantage on a manufacturing process.

Here, the layer having the common structure may be formed using a common mask in which all sub pixels are open. The layer having the common structure may be laminated with the same structure in all the sub pixels without having a pattern for every sub pixel. That is, a layer having the common structure is disposed to be connected or to extend to an adjacent sub pixel from one sub pixel without having a disconnected portion so that the layer is shared by a plurality of sub pixels.

For example, in addition to the green organic light emitting layer 132, at least one organic layer of a hole injection layer, a hole transporting layer, and an electron blocking layer is further disposed between the anode 131 and the cathode 133. The hole injection layer, the hole transporting layer, and the electron blocking layer may have a common structure to be commonly disposed in the plurality of sub pixels. In one example embodiment, the hole transporting layer may be a p-type hole transporting layer on which a p type dopant is doped. Or, at least one among an electron transporting layer, an electron injecting layer, and a hole blocking layer may be further disposed between the anode 131 and the cathode 133 of the green organic light emitting diode 130 in order to more smoothly move the electron into the organic light emitting layer. The electron transporting layer, the electron injecting layer, and the hole blocking layer may have a common structure which is disposed in common on the plurality of subpixels.

Each of the organic light emitting diodes 130, 140a, and 140b may be configured by one or more light emitting units. The one or more light emitting unit may be configured by an anode, at least one organic layer, at least one organic light emitting layer, and a cathode. That is, the one or more light emitting units refer to a light emitting unit including at least one organic layer and at least one organic light emitting layer between the anode and the cathode. Here, the light emitting unit may be represented as a stack. And, when the organic light emitting diode is configured by two or more light emitting units, the two or more light emitting units may be represented as tandem elements.

A charge generation layer may be disposed between one or more light emitting units. The charge generation layer adjusts to supply or move the charges between the light emitting units. For example, when the organic light emitting diode is configured by two light emitting units, the organic light emitting diode may be configured by an anode, a first organic layer, a first organic light emitting layer, a charge generating layer, a second organic layer, a second organic light emitting layer and a cathode. The first organic layer and the second organic layer may include at least one or more of an electron transporting layer, an electron injection layer, and a hole blocking layer, in addition to the hole injection layer, the hole transporting layer, the electron blocking layer, and the p-type hole transporting layer. Further, the first organic layer and the second organic layer may be disposed above or below the first organic light emitting layer and/or the second organic light emitting layer. The first organic light emitting layer and the second organic light emitting layer may be layers which emit a same color light. For example, the first organic light emitting layer and the second organic light emitting layer may be at least one among the red organic light emitting layer, the green organic light emitting layer, and the blue organic light emitting layer.

A bank layer 116 is disposed to define the sub pixel. In detail, the bank layer 116 is disposed to cover at least a part of an edge of the anode 131 to expose a part of a top surface of the anode 131.

As described above, the organic light emitting layer of the organic light emitting display device 100 may be patterned and deposited using a fine metal mask (FMM). The FMM includes an aperture area which is open for every emission area of the sub pixel. The red organic light emitting layer, the green organic light emitting layer, and the blue organic light emitting layer may be deposited in the emission areas of the red sub pixel SR, the green sub pixel SG, and the blue sub pixel SB through the aperture area of the FMM.

If a size of the sub pixel is so small, a spacing between the emission areas of the sub pixels is reduced and thus the spacing between the aperture areas of the FMM is also reduced. In the case of a high resolution organic light emitting display device 100, a size of the sub pixel is very small. Therefore, a distance between the emission areas of the sub pixels is very small. When the area of the emission area of the sub pixel is reduced, brightness of the sub pixel is reduced, thereby reducing a visibility of the organic light emitting display device 100. Therefore, it is required to reduce the size of the sub pixel while securing a size of the emission area of the sub pixel as large as possible.

Further, the FMM has a thin metal shape, so that the FMM may be loosened or curved by the gravity during a mask deposition process. In this instance, the area where the organic light emitting layer is deposited may be twisted and precision of the deposition process may be lowered. In order to avoid the above-mentioned problem, the FMM may be pulled in a specific direction during the FMM deposition process. In this instance, the pulling force may be tensile force. In this instance, the tensile force is applied to the aperture area of the FMM and the aperture area of the FMM may be deformed. When the aperture area of the FMM is deformed, there may be a problem in that the organic light emitting layer is not deposited in an exact position. However, when the area of the emission area of the sub pixel is maintained, there may be a problem in that the organic light emitting layers of the adjacent sub pixels overlap each other during a process of depositing the organic light emitting layer through the FMM. Therefore, there may be a color mixture problem in that colors of the organic light emitting layers of the adjacent sub pixels are mixed.

However, when the sub pixels are formed to have a zigzag pattern or an asymmetrical or irregular pattern, the sub pixels which emit same color light may be efficiently disposed in a small area with a sufficient margin. Therefore, the overlapping problem of the organic light emitting layers which may be caused during the process of depositing the organic light emitting layer using the FMM may be minimized. Further, the color mixture problem of the organic light emitting layers due to the overlapping of the organic light emitting layers may be minimized.

Further, emission areas of the red sub pixel SR, the green sub pixel SG, and the blue sub pixel SB have a specific shape. For example, as illustrated in FIG. 1, the red sub pixel SR, the green sub pixel SG, and the blue sub pixel SB have circular shaped emission areas. The emission areas of the red sub pixel SR, the green sub pixel SG, and the blue sub pixel SB are horizontally symmetrical with respect to one straight line which passes through the center of the emission area. For example, each of the emission areas of the red sub pixel SR, the green sub pixel SG, and the blue sub pixel SB may have a symmetrical shape, such as rhombus, a square, a regular hexagon, a regular octagon, or a circle. In this instance, the defect of the sub pixel of the organic light emitting display device 100 which may be generated during a manufacturing process may be minimized.

In the organic light emitting display device 100 of the present disclosure, two red sub pixels SR1 and SR2 or two blue sub pixels SB1 and SB2 which are disposed in the D1 direction or D2 direction may emit light by one driving transistor. Further, the light emitted from the sub pixel may be visibly recognized to be emitted from the area which is larger than an area of the actual aperture area of the sub pixel. That is, a user may recognize that the light is emitted from an area which is larger than an actual aperture area of the sub pixel.

Therefore, in the organic light emitting display device 100 of the present disclosure, two red sub pixels SR1 and SR2 or two blue sub pixels SB1 and SB2 simultaneously emit light by one driving transistor in one pixel, respectively. That is, according to the example embodiment of the present disclosure, in the organic light emitting display device 100, the sub pixels which emit a same color light are disposed in one pixel to be separated from each other. Therefore, even though an aperture ratio of the emission area in the sub pixel is kept constant or reduced, the user may recognize that light is substantially emitted from an area which is larger than that of one pixel, through two separated sub pixels. In other words, in the organic light emitting display device 100 of the present disclosure, a cognitive fill factor may be improved. Therefore, as the cognitive fill factor is improved, an area which is actually recognized by the user is increased. Therefore, the user may recognize an image having a high resolution.

Figure 4:
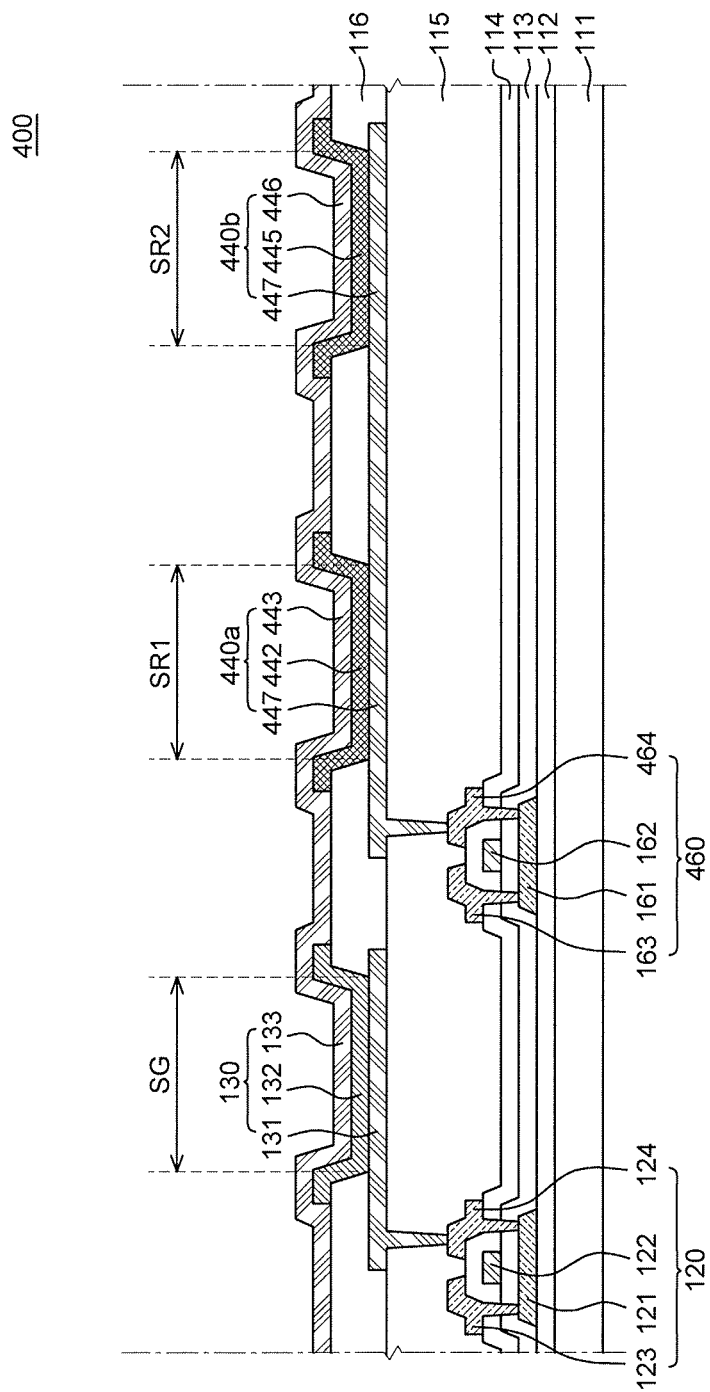
FIG. 4 is a schematic cross-sectional view taken along III-III' of FIG. 2 illustrating an organic light emitting display device according to another example embodiment of the present disclosure.

FIG. 4 is a schematic cross-sectional view taken along III-III' of FIG. 2 illustrating an organic light emitting display device according to another example embodiment of the present disclosure. An organic light emitting display device 400 according to another example embodiment of the present disclosure illustrated in FIG. 4 has a substantially same configuration as the organic light emitting device 100 illustrated in FIGS. 1 and 2 except a configuration of the anodes of the first red sub pixel SR1 and the second red sub pixel SR2. Therefore, redundant description thereof will be omitted or will be briefly made below.

Referring to FIG. 4, a first red organic light emitting diode 440a is formed in a first red sub pixel SR1 and a second red organic light emitting diode 440b is formed in a second red sub pixel SR2. The first red organic light emitting diode 440a includes an anode 447 of the red sub pixel, a first red organic light emitting layer 442, and a cathode 443 of the first red sub pixel. The second red organic light emitting diode 440b includes an anode 447 of the red sub pixel, a second red organic light emitting layer 445, and a cathode 446 of the second red sub pixel.

Here, the anode 447 of the first red sub pixel SR1 is connected to a second driving transistor 460. In detail, the anode 447 of the first red sub pixel SR1 is connected to a drain electrode 464 of the second driving transistor 460. The first red sub pixel SR1 and the second red sub pixel SR2 may be separated into two sub pixels in one pixel, by a bank layer 116.

Therefore, the first red sub pixel SR1 and the second red sub pixel SR2 may simultaneously emit light by one driving transistor. That is, the sub pixel which is disposed to be separated in one pixel and emits a same color light may be visibly recognized to emit the same color light in two separated areas by only one driving transistor.

The organic light emitting display device 400 according to another example embodiment of the present disclosure includes only one common anode to configure two separated sub pixels in one pixel. That is, in the organic light emitting display device 400, in order to separate the sub pixel, the bank layer is disposed on a common anode without performing a patterning process using a separate mask. Therefore, the sub pixel which emits the same color light in one pixel may be separated into two sub pixels through a simple process.

Figure 5:
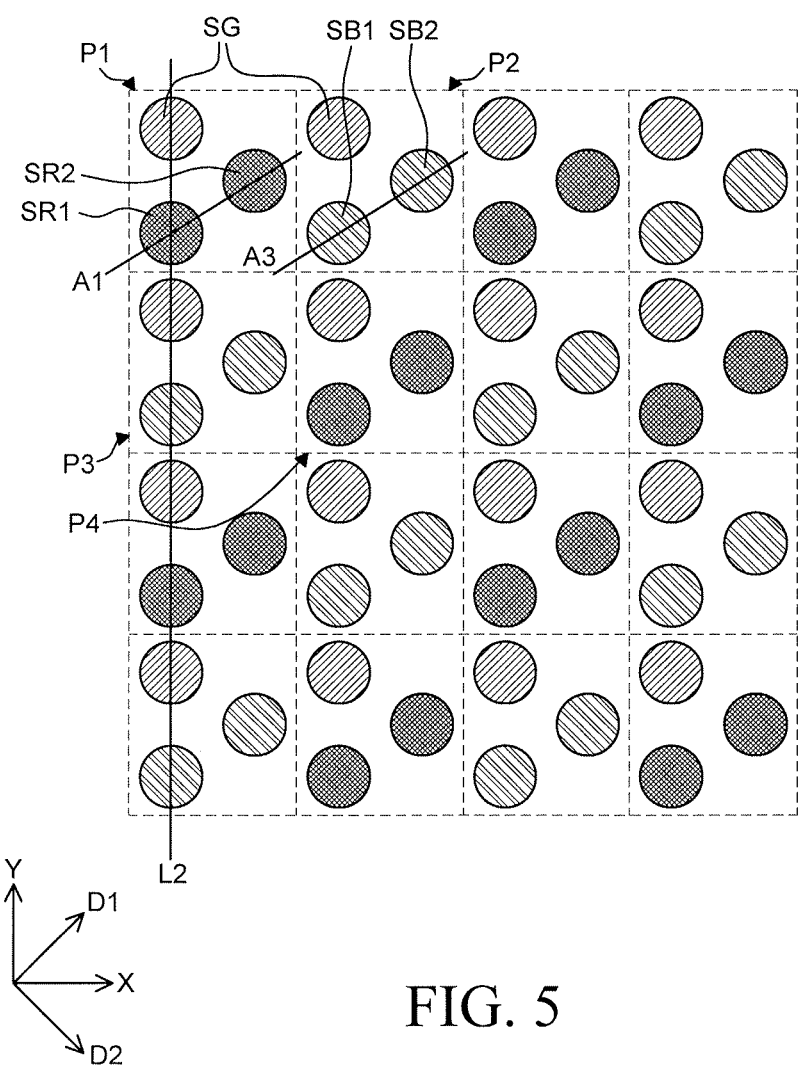
FIG. 5 is a schematic plan view illustrating an organic light emitting display device according to another example embodiment of the present disclosure.

FIG. 5 is a schematic plan view illustrating an organic light emitting display device according to another example embodiment of the present disclosure. An organic light emitting display device 500 according to another example embodiment of the present disclosure illustrated in FIG. 5 has a substantially same configuration as the organic light emitting device 100 illustrated in FIGS. 1 and 2 except an arrangement of two blue sub pixels SB1 and SB2 in some pixels. Therefore, redundant description thereof will be omitted or will be briefly made below.

Referring to FIG. 5, one pixel includes one green sub pixel SG and two red sub pixels SR1 and SR2 or one green sub pixel SG and two blue sub pixels SB1 and SB2. At least one sub pixel among the green sub pixel SG, one red sub pixel between two red sub pixels SR1 and SR2, and one blue sub pixel between two blue sub pixels SB1 and SB2 is not disposed on the same straight line. And, the first pixel P1 and the second pixel P2 are adjacent in a row direction and the green sub pixels SG of the first pixel P1 and the second pixel P2 are disposed on the same straight line in the row direction. Here, the row direction may be the first direction.

Further, the arrangement of sub pixels in a first pixel P1 is the same as the arrangement of sub pixels in a fourth pixel P4 and the arrangement of sub pixels in a second pixel P2 is the same as the arrangement of sub pixels in a third pixel P3. For example, when two red sub pixels SR1 and SR2 are disposed in a third direction in the first pixel P1, two red sub pixels SR1 and SR2 are also disposed in the third direction in the fourth pixel P4. Similarly, when two blue sub pixels SB1 and SB2 are disposed in a third direction in the second pixel P2, two blue sub pixels SB1 and SB2 are also disposed in the third direction in the third pixel P3.

Referring to FIG. 5, the green sub pixel SG of the first pixel P1 and the green sub pixel SG of the third pixel P3 which is adjacent to the first pixel P1 in the second direction are disposed on a second straight line L2 extending in the second direction. In the first pixel P1, two red sub pixels SR1 and SR2 are disposed on a first diagonal line A1 extending in the third direction. In the second pixel P2, two blue sub pixels SB1 and SB2 are disposed on a third diagonal line A3 extending in the third direction. And, the arrangement of sub pixels in the first pixel P1 is the same as the arrangement of sub pixels in the fourth pixel P4 and the arrangement of sub pixels in the second pixel P2 is the same as the arrangement of sub pixels in the third pixel P3.

In detail, when two blue sub pixels SB1 and SB2 are disposed in one pixel, a first blue sub pixel SB1 between two blue sub pixels SB1 and SB2 may be disposed on a second straight line L2 in the y-axis direction which is the same as the green sub pixel SG and the second blue sub pixel SB2 may be disposed in a diagonal line which is the D2 direction with respect to the green sub pixel SG.

Further, when two red sub pixels SR1 and SR2 are disposed on the first diagonal line A1 which is the D1 direction in the first pixel P1 which is one reference pixel, two blue sub pixels SB1 and SB2 are disposed on the first diagonal line A1 which is the D1 direction in a pixel adjacent to the first pixel P1 which is a reference pixel in the y-axis direction. Similarly, when two blue sub pixels SB1 and SB2 are disposed in the third diagonal line A3 which is the D1 direction in the second pixel P2 which is one reference pixel, two red sub pixels SR1 and SR2 are disposed on the third diagonal line A3 which is the D1 direction in a pixel adjacent to the reference pixel in the y-axis direction.

That is, in the organic light emitting display device 500 according to another exemplary embodiment of the present disclosure, all of the two red sub pixels SR1 and SR2 and the two blue sub pixels SB1 and SB2 are disposed on the diagonal line which is the D1 direction. Therefore, on the diagonal line which is the D1 direction, the sub pixels are disposed in the order of red-red-green-(space)-blue-blue-green-(space), . . . . That is, in the organic light emitting display device 500 of the present disclosure, the sub pixels which are arranged in the D1 direction are irregularly and asymmetrically arranged. Therefore, in the organic light emitting display device 500, a lattice artifact may be significantly reduced by irregularly and asymmetrically arranging the sub pixels.

Figure 6:
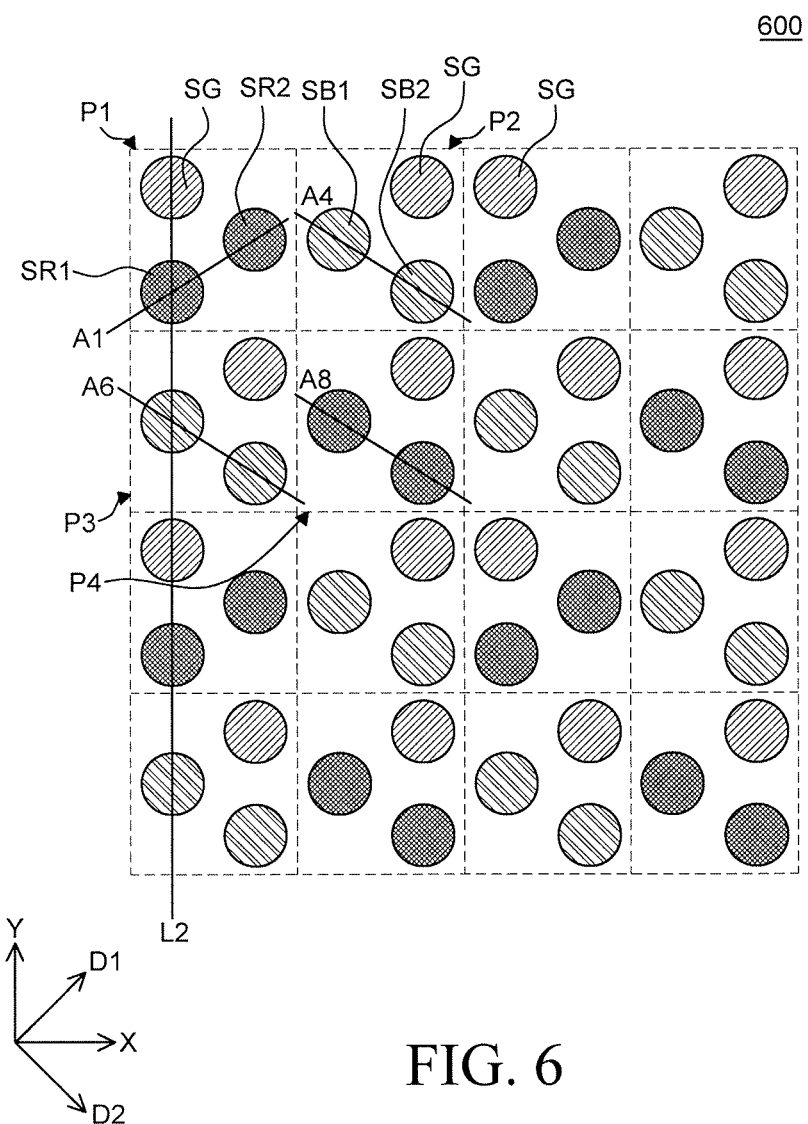
FIG. 6 is a schematic plan view illustrating an organic light emitting display device according to another example embodiment of the present disclosure.

FIG. 6 is a schematic plan view illustrating an organic light emitting display device according to another example embodiment of the present disclosure. The organic light emitting display device 600 illustrated in FIG. 6 has the substantially same configuration as the organic light emitting display device 100 illustrated in FIG. 1 except the arrangement position and relationship of the sub pixels. Therefore, the redundant description thereof will be omitted or will be briefly made below.

Referring to FIG. 6, at least one sub pixel among the green sub pixel SG, one red sub pixel between two red sub pixels SR1 and SR2, and one blue sub pixel between two blue sub pixels SB1 and SB2 is not disposed on the same straight line. And, the first pixel P1 and the second pixel P2 are adjacent in a row direction and the green sub pixels SG of the first pixel P1 and the second pixel P2 are disposed on the same straight line in the row direction. Here, the row direction may be the first direction.

In detail, the arrangement of the sub pixels in the third pixel P3 is the same as the arrangement of the sub pixels in the second pixel P2. Two red sub pixels SR1 and SR2 of the first pixel P1 are disposed on the first diagonal line A1 extending in a third direction and two red sub pixels SR1 and SR2 of the fourth pixel P4 are disposed in the eighth diagonal line A8 extending in the fourth direction. Two blue sub pixels SB1 and SB2 of the second pixel P2 are disposed on the fourth diagonal line A4 extending in the fourth direction and two blue sub pixels SB1 and SB2 of the third pixel P3 are disposed in the sixth diagonal line A6 extending in the fourth direction. Further, a straight line connecting a center of the green sub pixel SG of the first pixel P1 and a center of the green sub pixel SG of the third pixel P3 intersects the second straight line L2 extending in the second direction.

In detail, in one pixel, the green sub pixel SG is disposed at an upper left or right side of the pixel. When in one reference pixel, two red sub pixels SR are disposed in the first diagonal line A1 of the D1 direction, in a pixel adjacent to the reference pixel in the x-axis direction, two blue sub pixels SB are disposed on the fourth diagonal line A4 of the D2 direction. Further, also in a pixel adjacent to the reference pixel in the y-axis direction, two blue sub pixels SB are disposed on the sixth diagonal line A6 of the D2 direction. In the pixel adjacent to the reference pixel in the D2 direction, two red sub pixels SR are disposed on the eighth diagonal line A8 of the D2 direction.

In the organic light emitting display device 600 according to another exemplary embodiment of the present disclosure, even though each of the green sub pixel SG, the red sub pixel SR, and the blue sub pixel SB is partially regularly arranged, each of the sub pixels which emit a same color light is arranged to be sufficiently spaced apart from each other. Therefore, stress which is applied to the aperture area of an FMM during a deposition process using the FMM may be distributed and the deformation of the FMM may be minimized, thereby improving precision of the deposition. Further, as the deformation of the FMM is minimized, the problem in that the organic light emitting layers which are deposited through the FMM overlap may be reduced. Further, a color mixture problem of the organic light emitting layer due to the overlapping of the organic light emitting layers may be minimized.

Figure 7:
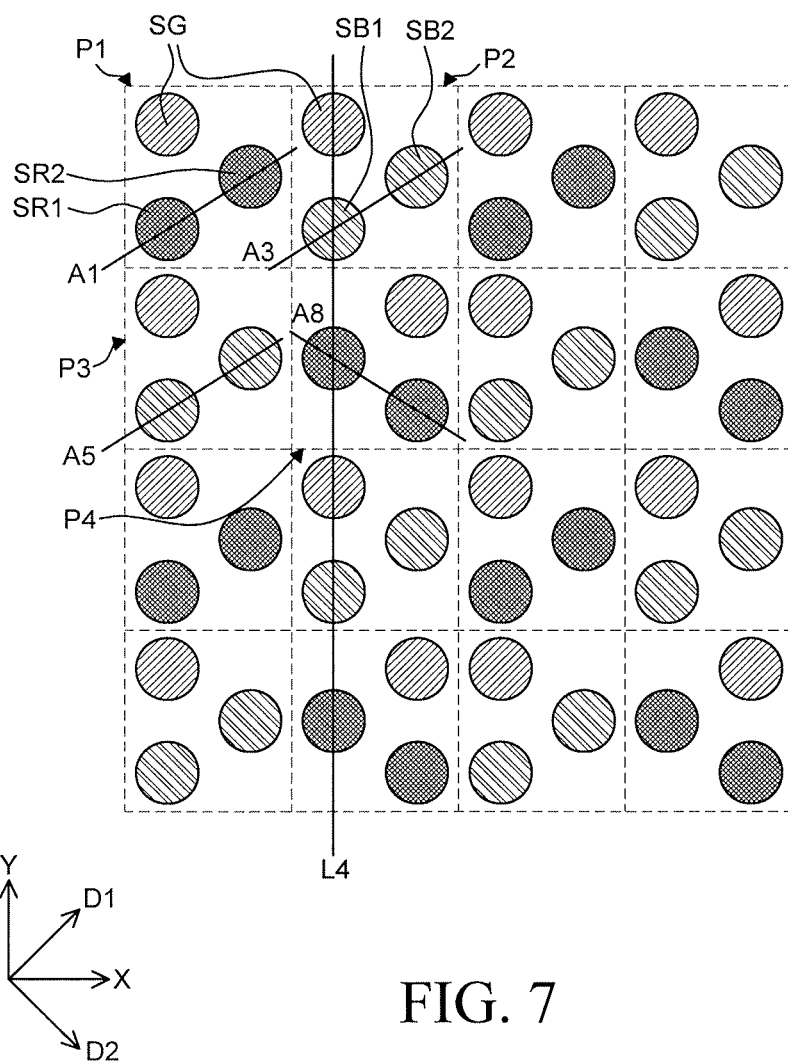
FIG. 7 is a schematic plan view illustrating an organic light emitting display device according to another example embodiment of the present disclosure.

FIG. 7 is a schematic plan view illustrating an organic light emitting display device according to another example embodiment of the present disclosure. The organic light emitting display device 700 illustrated in FIG. 7 has the substantially same configuration as the organic light emitting display device 100 illustrated in FIG. 1 except the arrangement position and relationship of the sub pixels. Therefore, the redundant description thereof will be omitted or will be briefly made below.

Referring to FIG. 7, at least one sub pixel among the green sub pixel SG, one red sub pixel between two red sub pixels SR1 and SR2, and one blue sub pixel between two blue sub pixels SB1 and SB2 is not disposed on the same straight line. And, the first pixel P1 and the second pixel P2 are adjacent in a row direction and the green sub pixels SG of the first pixel P1 and the second pixel P2 are disposed on the same straight line in the row direction. Here, the row direction may be the first direction.

In detail, the arrangement of the sub pixels in the third pixel P3 is the same as the arrangement of the sub pixels in the second pixel P2. Two red sub pixels SR1 and SR2 of the first pixel P1 are disposed on the first diagonal line A1 extending in a third direction and two red sub pixels SR1 and SR2 of the fourth pixel P4 are disposed in the eighth diagonal line A8 extending in the fourth direction. Two blue sub pixels SB1 and SB2 of the second pixel P2 are disposed on the third diagonal line A3 extending in the third direction and two blue sub pixels SB1 and SB2 of the third pixel P3 are disposed in the fifth diagonal line A3 extending in the third direction. Further, a straight line connecting a center of the green sub pixel SG of the second pixel P2 and a center of the green sub pixel SG of the fourth pixel P4 intersects the fourth straight line L4 extending in the second direction.

In detail, in one pixel, the green sub pixel SG is disposed at an upper left or right side of the pixel. When two red sub pixels SR of one reference pixel are disposed on the first diagonal line A1 of the D1 direction, also in a pixel adjacent to the reference pixel in the x-axis direction and a pixel adjacent to the reference pixel in the y-direction, two blue sub pixels SB are disposed on the third diagonal line A3 of the D1 direction. In the pixel adjacent to the reference pixel in the D2 direction, the green sub pixel SG is disposed on an upper right side of the pixel and two red sub pixel SR are disposed on the eighth diagonal line A8 in the D2 direction.

In the organic light emitting display device 700 according to another example embodiment of the present disclosure, even though each of the green sub pixel SG, the red sub pixel SR, and the blue sub pixel SB is partially regularly arranged, each of sub pixels which emit a same color light is arranged to be sufficiently spaced apart from each other. Therefore, stress which is applied to the aperture area of the FMM during a deposition process using the FMM may be distributed and the deformation of the FMM may be minimized, thereby improving precision of the deposition. Further, as the deformation of the FMM is minimized, the problem that the organic light emitting layers which are deposited through the FMM overlap may be reduced. Also, a color mixture problem of the organic light emitting layer may be minimized.

Figure 8:
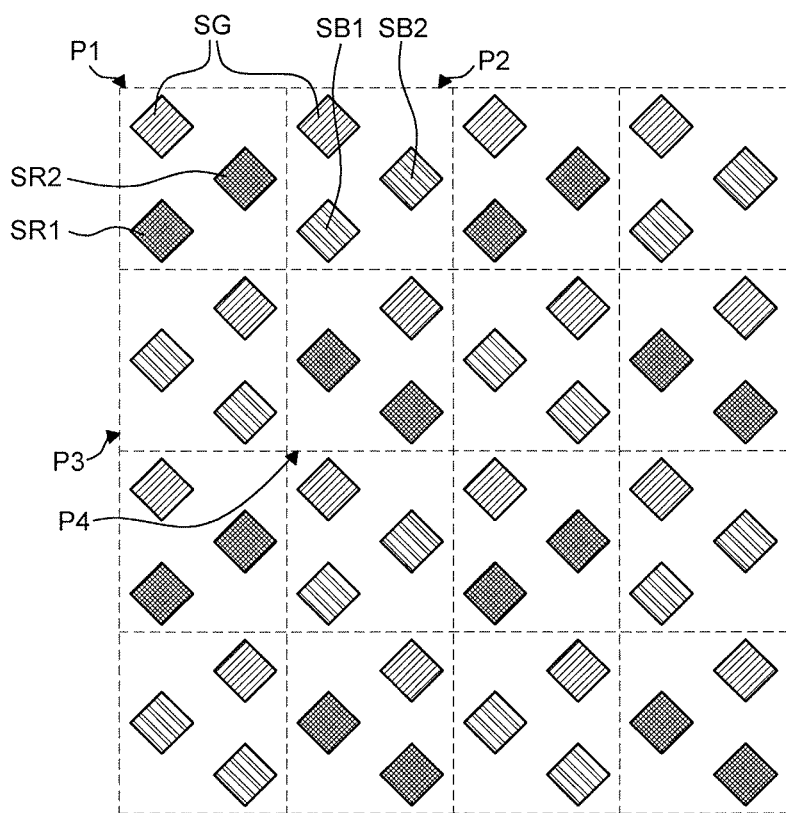
FIG. 8 is a schematic plan view illustrating an organic light emitting display device according to another example embodiment of the present disclosure.

FIG. 8 is a schematic plan view illustrating an organic light emitting display device according to another example embodiment of the present disclosure. An organic light emitting display device 800 according to another example embodiment of the present disclosure illustrated in FIG. 8 has a substantially same configuration as the organic light emitting device 100 illustrated in FIGS. 1 and 2 except a shape of the sub pixels. Therefore, redundant description thereof will be omitted or will be briefly made below.

Referring to FIG. 8, at least one sub pixel among the green sub pixel SG, one red sub pixel between two red sub pixels SR1 and SR2, and one blue sub pixel between two blue sub pixels SB1 and SB2 is not disposed on the same straight line. And, the first pixel P1 and the second pixel P2 are adjacent in a row direction and the green sub pixels SG of the first pixel P1 and the second pixel P2 are disposed on the same straight line in the row direction. Here, the row direction may be the first direction. Further, the green sub pixel SG, the red sub pixel SR1 and SR2 and the blue sub pixels SB1 and SB2 are spaced apart from each other and have a quadrangular shape.

In detail, the green sub pixel SG, the first red sub pixel SP1, the second red sub pixel SR2, the first blue sub pixel SB1, and the second blue sub pixel SB2 have a quadrangular shape. In this instance, the emission area in the sub pixel is a quadrangle, so that the arrangement of the sub pixels may be more irregularly arranged.

Here, the shapes of the green sub pixel SG, the first red sub pixel SP1, the second red sub pixel SR2, the first blue sub pixel SB1, and the second blue sub pixel SB2 may be various types of quadrangles. Desirably, the shapes of the green sub pixel SG, the first red sub pixel SP1, the second red sub pixel SR2, the first blue sub pixel SB1, and the second blue sub pixel SB2 may be rhombus or square. That is, in the organic light emitting display device 800, the shape of each of the sub pixels may have symmetry. Therefore, the stress which is applied to the aperture area of the FMM during the deposition process using the FMM may be distributed. In other words, during the deposition process using the FMM, in order to improve the deformation of the FMM or deposition precision, the FMM may be pulled to a specific direction. In this instance, the force which is pulled may be referred to as a tensile force. Since the shape of each of the sub pixels has symmetry, even though the FMM is pulled during the deposition process using the FMM, the same tensile force may be applied to the aperture area of the FMM. Therefore, the stress at the time when the FMM is pulled may be uniformly distributed in the aperture area of the FMM during the deposition process using the FMM and the deformation of the FMM may be minimized. Therefore, the precision of the deposition of the organic light emitting layer may be improved.

However, in the organic light emitting display device 800, the shape of each of the sub pixels is not restricted so as to have symmetry. Further, in the organic light emitting display device 800, each of the sub pixels may be formed to have an asymmetric shape so that the deformation of the FMM is minimized to suppress the overlapping problem of the organic light emitting layers. That is, in the organic light emitting display device 800, the shape of each of the sub pixels may be freely modified so as not to cause the overlapping problem and other problems including a color mixture problem due to the deposition of the organic light emitting layers through the FMM.

Furthermore, in the organic light emitting display device according to the example embodiment of the present disclosure, each of the sub pixels may have various shapes and sizes so as to be suitable for a predetermined brightness and a predetermined color temperature.

Figure 9:
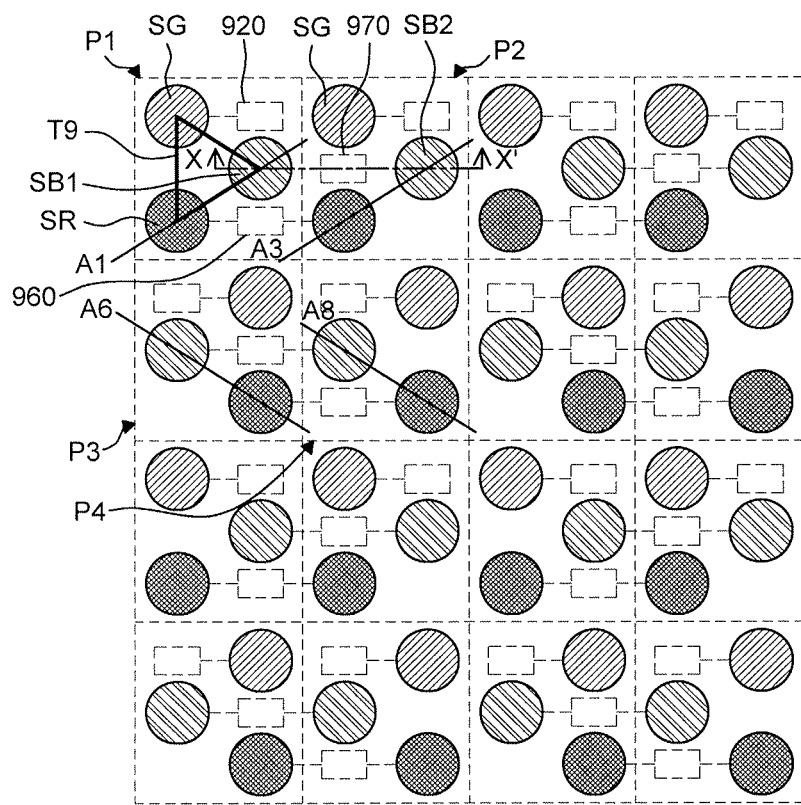
FIG. 9 is a schematic plan view illustrating an organic light emitting display device according to another example embodiment of the present disclosure.
Figure 10:
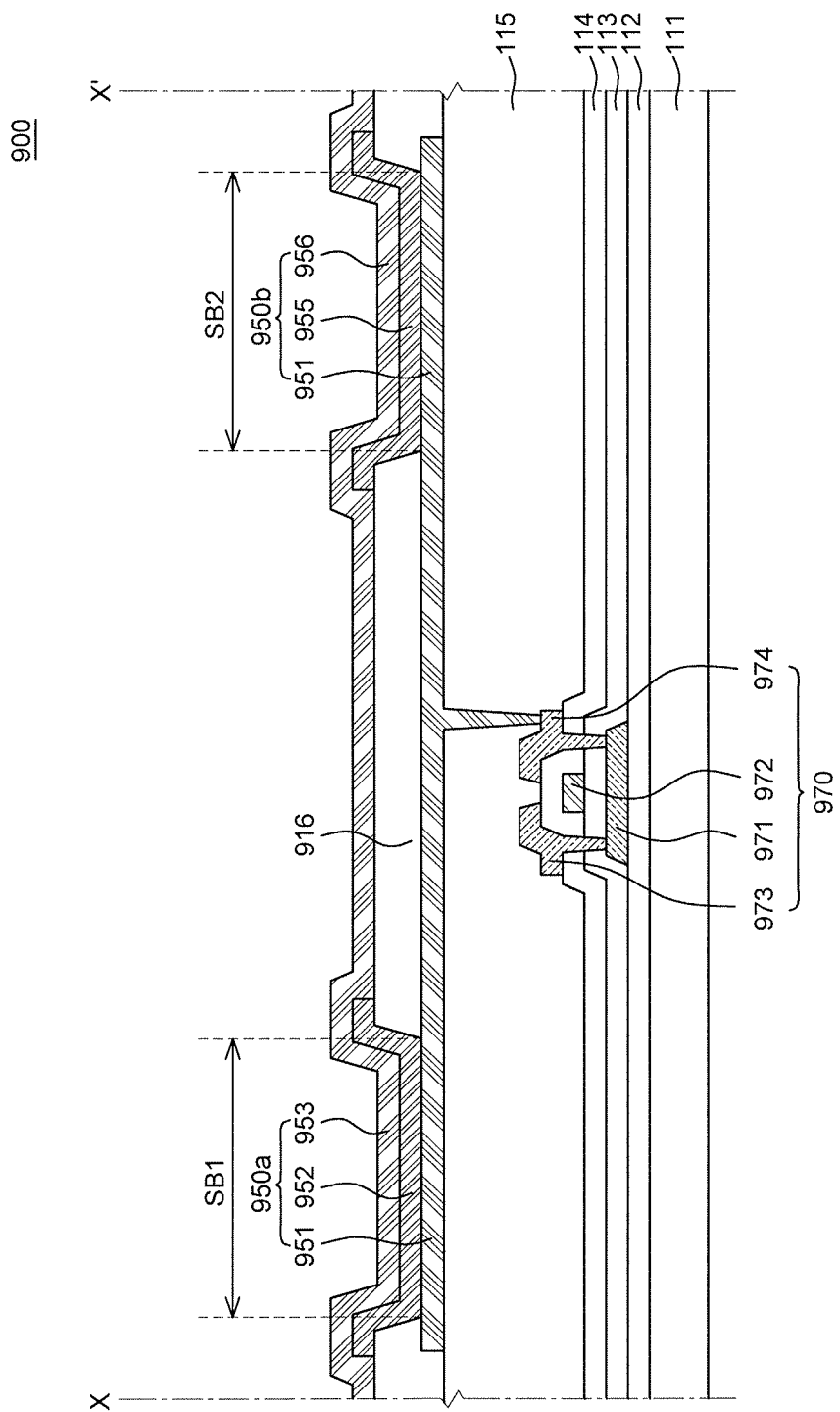
FIG. 10 is a schematic cross-sectional view taken along X-X' of FIG. 9 illustrating an organic light emitting display device according to another example embodiment of the present disclosure.

FIG. 9 is a schematic plan view illustrating an organic light emitting display device according to another example embodiment of the present disclosure. FIG. 10 is a schematic cross-sectional view taken along X-X' of FIG. 9 illustrating an organic light emitting display device according to another example embodiment of the present disclosure. In FIG. 9, only a sub pixel and a driving transistor of the organic light emitting display device 900 are schematically illustrated but other detailed components of the organic light emitting display device 900 are not illustrated.

The organic light emitting display device 900 illustrated in FIG. 9 has a substantially same configuration as the organic light emitting display device 100 illustrated in FIG. 2 except a configuration of the sub pixels included in one pixel and a relationship with a driving transistor. Therefore, the redundant description thereof will be omitted or will be briefly made below. Among the configurations of the organic light emitting display device 900 illustrated in FIG. 10, configurations denoted by the same reference numerals as the organic light emitting display device 100 illustrated in FIG. 3 are substantially same configurations as those in FIG. 3, so that redundant description thereof will be omitted or will be briefly made below.

Referring to FIG. 9, each of a plurality of pixels includes a green sub pixel SG, a red sub pixel SR, and a blue sub pixel SB. Further, the plurality of pixels include a first pixel P1, a second pixel P2 which is adjacent to the first pixel P1 in the first direction, a third pixel P3 which is adjacent to the first pixel P1 in the second direction, and a fourth pixel P4 which is adjacent to the second pixel P2 in the second direction. Straight lines connecting centers of three sub pixels in each of the plurality of pixels form a triangle T9.

Referring to FIG. 9, at least one sub pixel among the green sub pixel SG, one red sub pixel between two red sub pixels SR1 and SR2, and one blue sub pixel between two blue sub pixels SB1 and SB2 is not disposed on the same straight line. And, the first pixel P1 and the second pixel P2 are adjacent in a row direction and the green sub pixels SG of the first pixel P1 and the second pixel P2 are disposed on the same straight line in the row direction. Here, the row direction may be the first direction. Further, the first pixel P1 and the fourth pixel P4 are asymmetrical to each other and the second pixel P2 and the third pixel P3 are asymmetrical to each other.

In detail, the arrangement of sub pixels in the first pixel P1 is the same as the arrangement of sub pixels in the second pixel P2 and the arrangement of sub pixels in the third pixel P3 is the same as the arrangement of sub pixels in the fourth pixel P4. For example, in the first pixel P1 illustrated in FIG. 9, the red sub pixel SR and the blue sub pixel SB are disposed on the first diagonal line A1 extending in the third direction. And, in the second pixel P2, the red sub pixel SR and the blue sub pixel SB are disposed on the third diagonal line A3 extending in the third direction. Further, in the third pixel P3, the red sub pixel SR and the blue sub pixel SB are disposed on the sixth diagonal line A6 extending in the fourth direction. And, in the fourth pixel P4, the red sub pixel SR and the blue sub pixel SB are disposed on the eighth diagonal line A8 extending in the fourth direction.

Referring to FIG. 9, each of the plurality of pixels includes three sub pixels and two driving transistors which control three sub pixels to emit light. Further, in one pixel, two driving transistors include a first driving transistor 920 which is connected to the green sub pixel SG, and a second driving transistor 960 which is connected to the red sub pixel SR of the first pixel P1 and the red sub pixel SR of the second pixel P2 or a third driving transistor 970 which is connected to the blue sub pixel SB of the first pixel P1 and the blue sub pixel SB of the second pixel P2.

In detail, the first driving transistor 920 is connected to each of the green sub pixels SG in the pixel. And, the second driving transistor 960 is simultaneously connected to a red sub pixel SR of one reference pixel and a red sub pixel SR in a pixel which is adjacent to the reference pixel in the x-axis direction. Similarly, the third driving transistor 970 is simultaneously connected to a blue sub pixel SB of one reference pixel and a blue sub pixel SB in a pixel which is adjacent to the reference pixel in the x-axis direction. By doing this, in one pixel, the first driving transistor 920 which is connected to the green sub pixel SG and one of the second driving transistor 960 which is connected to the red sub pixel SR and the third driving transistor 970 which is connected to the blue sub pixel SB are disposed. Therefore, a total of two driving transistors is disposed in one pixel.

For the convenience of description, a connection relationship between blue organic light emitting diodes 950a and 950b and the third driving transistor 970 will be described with respect to the third driving transistor 970 which is connected to a blue sub pixel SB, with reference to FIG. 10. Redundant description from description of FIGS. 3 and 4 regarding the configuration of the blue organic light emitting diodes 950a and 950b and the configuration of the third driving transistor 970 will be omitted or will be briefly made below.

Referring to FIG. 10, the third driving transistor 970 is disposed on a buffer layer 112. The third driving transistor 970 includes an active layer 971, a gate electrode 972, a source electrode 973, and a drain electrode 974. A first blue organic light emitting diode 950a is formed in a first blue sub pixel SB1 and a second blue organic light emitting diode 950b is formed in a second blue sub pixel SB2. The first blue organic light emitting diode 950a includes an anode 951 of the blue sub pixel, a first blue organic light emitting layer 952, and a cathode 953 of the first blue sub pixel. The second blue organic light emitting diode 950b includes an anode 951 of the blue sub pixel, a second blue organic light emitting layer 955, and a cathode 956 of the second blue sub pixel.

Here, the anode 951 of the blue sub pixel is connected to the third driving transistor 970. In detail, the anode 951 of the blue sub pixel is connected to the drain electrode 974 of the third driving transistor 970. However, the first blue sub pixel SB1 and the second blue sub pixel SB2 are separated by a bank layer 916 to be disposed in different pixels, respectively.

Therefore, even though the first blue sub pixel SB1 and the second blue sub pixel SB2 are disposed in different pixels, the light emission may be controlled by one driving transistor. That is, the sub pixels which are disposed in different adjacent pixels but emit a same color light may emit light by one driving transistor and may be controlled to emit light. Therefore, two adjacent pixels may emit light in various manners.

And, even though a configuration in which one third driving transistor 970 is connected to an anode of one blue sub pixel is illustrated in FIG. 10, one third driving transistor 970 may be connected to the anode of the blue sub pixel SB in various manners to simultaneously drive the blue sub pixels SB which are disposed in adjacent pixels. For example, similarly to the organic light emitting display device 100 illustrated in FIG. 3, a part of the drain electrode 974 of the third driving transistor 970 extends to be connected to the anode of the patterned blue sub pixel for every blue sub pixel SB. That is, the red sub pixel SR and the blue sub pixel SB are commonly connected to one driving transistor between two pixels which are adjacent to each other in the x-axis direction. Thus, each of an anode of the red sub pixel SR and an anode of the blue sub pixel SB may be connected to one driving transistor.

In addition, the organic light emitting display device 900 according to another example embodiment of the present disclosure may use only one driving transistor to allow sub pixels which emit a same color light to emit light in two adjacent pixels. Further, the sub pixels which emit the same color light in two adjacent pixels may include one common anode to be connected to one driving transistor.

Therefore, in the organic light emitting display device 900, in order to separate the sub pixel, the bank layer is disposed on an anode without performing a patterning process using a separate mask. Therefore, the sub pixels which emit the same color light in two adjacent pixels may be connected to one driving transistor through a more simple process. Further, the sub pixels which are connected in two adjacent pixels only by one driving transistor may independently or simultaneously emit light through a "rendering." Therefore, as the resolution of the organic light emitting display device 900 becomes higher, pixel arrangement can be made more efficiently and the pixel may efficiently emit light.

Figure 11:
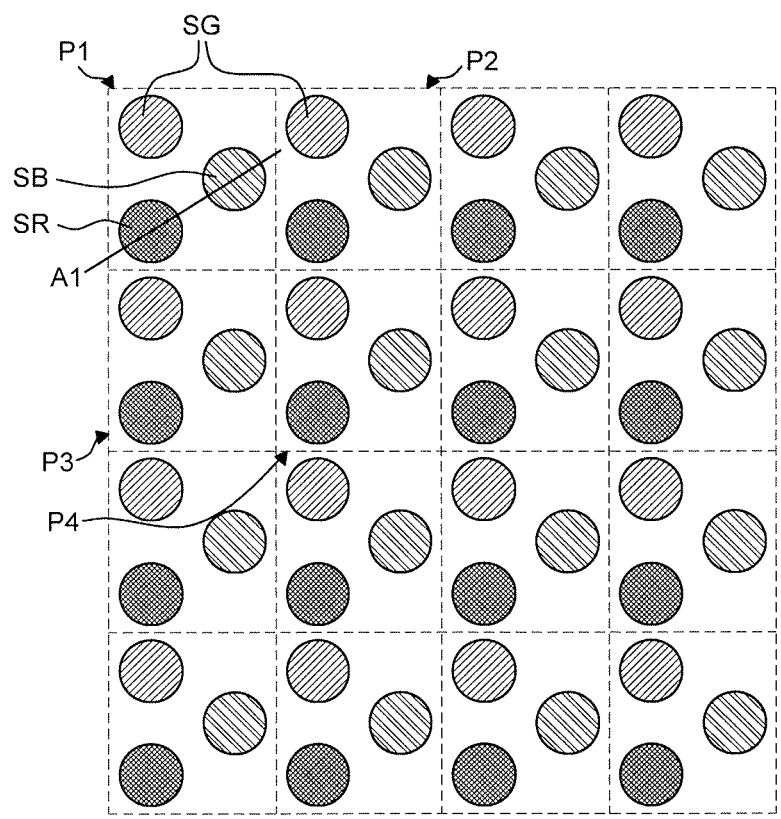
FIG. 11 is a schematic plan view illustrating an organic light emitting display device according to another example embodiment of the present disclosure.

FIG. 11 is a schematic plan view illustrating an organic light emitting display device according to another example embodiment of the present disclosure. The organic light emitting display device 1100 illustrated in FIG. 11 has the substantially same configuration as the organic light emitting display device 900 illustrated in FIG. 9 except the arrangement position and arrangement relationship of the sub pixels. Therefore, the redundant description thereof will be omitted or will be briefly made below.

Referring to FIG. 11, each of a plurality of pixels includes a green sub pixel SG, a red sub pixel SR, and a blue sub pixel SB. In detail, the arrangement of sub pixels in the first pixel P1 is the same as the arrangement of sub pixels in the second pixel P2 and the arrangement of sub pixels in the third pixel P3 is the same as the arrangement of sub pixels in the fourth pixel P4. Further, the arrangement of the sub pixels in the first pixel P1 is the same as the arrangement of the sub pixels in the third pixel P3. For example, in the first pixel P1 illustrated in FIG. 11, the red sub pixel SR and the blue sub pixel SB are disposed on a first diagonal line A1 extending in the third direction. Also in the second pixel P2, the third pixel P3, and the fourth pixel P4, the red sub pixel SR and the blue sub pixel SB are disposed on a diagonal line extending in the third direction. That is, in each of the plurality of pixels, the arrangements of the sub pixels are same. The arrangement of the sub pixels illustrated in FIG. 11 is illustrative. The sub pixels may be disposed in various manners such that straight lines connecting centers of the sub pixels form a triangle.

Referring to FIG. 11, in one pixel, the green sub pixel SG is disposed at an upper left side and the red sub pixel SR is disposed on a straight line in a y-axis direction extending from the green sub pixel SG to be disposed at a lower left side of the pixel. The blue sub pixel SB is disposed at a right center in one pixel.

In FIG. 11, it is illustrated that the green sub pixel SG, the red sub pixel SR, and the blue sub pixel SB are regularly disposed between adjacent pixels. However, when the masks can be irregularly manufactured by a FMM process, the green sub pixel SG, the red sub pixel SR, and the blue sub pixel SB in every pixel may be irregularly disposed with an angle with respect to the green sub pixel SG, the red sub pixel SR, and the blue sub pixel SB disposed in an adjacent pixel.

In the organic light emitting display device 1100 according to another example embodiment of the present disclosure, even though each of the green sub pixel SG, the red sub pixel SR, and the blue sub pixel SB is partially regularly arranged, sub pixels which emit a same color light are arranged to be sufficiently spaced apart from each other. Therefore, stress which is applied to the aperture area of the FMM during a deposition process using the FMM may be distributed and the deformation of the FMM may be minimized, thereby improving precision of the deposition. Further, as the deformation of the FMM is minimized, the problem that the organic light emitting layers which are deposited through the FMM overlap may be reduced. Further, a color mixture problem of the organic light emitting layer due to the overlapping of the organic light emitting layers may be minimized.

Figure 12:
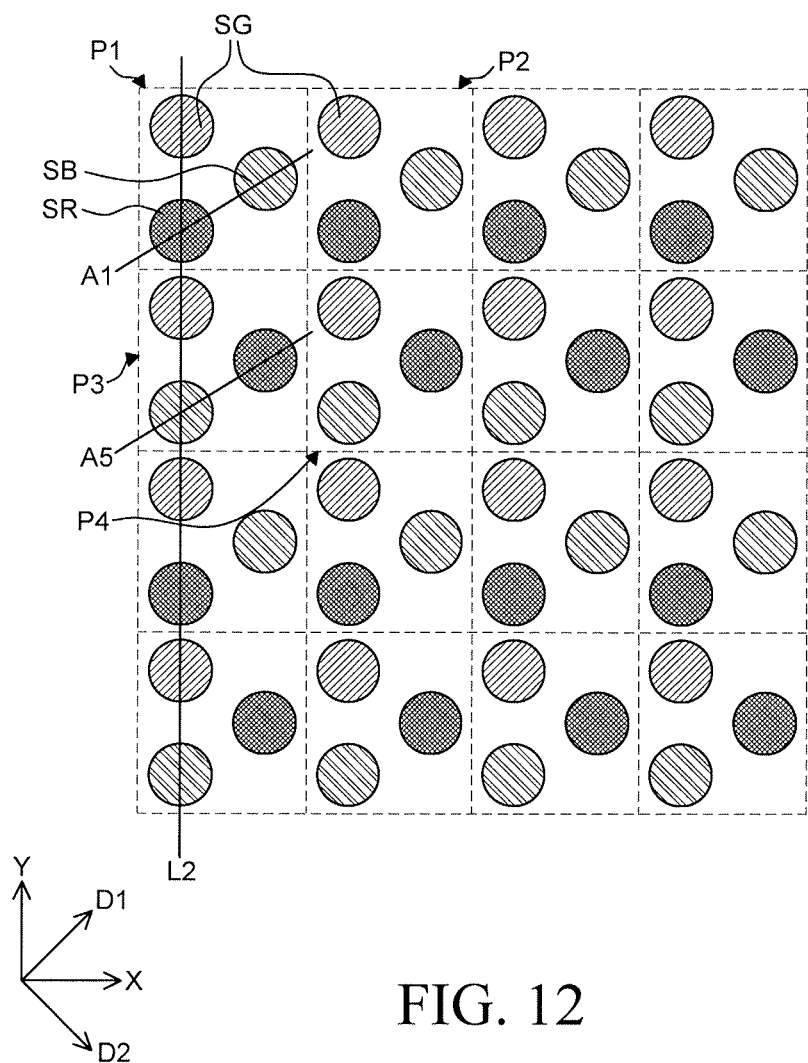
FIG. 12 is a schematic plan view illustrating an organic light emitting display device according to another example embodiment of the present disclosure.

FIG. 12 is a schematic plan view illustrating an organic light emitting display device according to another example embodiment of the present disclosure. The organic light emitting display device 1200 illustrated in FIG. 12 has the substantially same configuration as the organic light emitting display device 1100 illustrated in FIG. 11 except the arrangement relationship of some of red sub pixel SR and blue sub pixel SB among the sub pixels. Therefore, the redundant description thereof will be omitted or will be briefly made below.

Referring to FIG. 12, each of a plurality of pixels includes a green sub pixel SG, a red sub pixel SR, and a blue sub pixel SB. In detail, the arrangement of sub pixels in the first pixel P1 is the same as the arrangement of sub pixels in the second pixel P2 and the arrangement of sub pixels in the third pixel P3 is the same as the arrangement of sub pixels in the fourth pixel P4. Further, in the first pixel P1, the red sub pixel SR and the blue sub pixel SB are disposed on the first diagonal line A1 extending in the third direction. And, in the third pixel P3, the red sub pixel SR and the blue sub pixel SB are disposed on the fifth diagonal line A5 extending in the third direction.

Further, a straight line connecting a center of the red sub pixel SR of the first pixel P1 and a center of the red sub pixel SR of the third pixel P3 intersects the second straight line L2 extending in the second direction. Similarly, a straight line connecting a center of the blue sub pixel SB of the first pixel P1 and a center of the blue sub pixel SB of the third pixel P3 intersects the second straight line L2 extending in the second direction. For example, in the first pixel P1 illustrated in FIG. 12, the red sub pixel SR is disposed at a lower left side of the first pixel and the blue sub pixel SB is disposed at a right center of the first pixel P1. In contrast, in the third pixel P3, the red sub pixel SR is disposed at a right center of the third pixel P3 and the blue sub pixel SB is disposed at a lower left side of the third pixel P3.

Referring to FIG. 12, in all pixels, the green sub pixel SG is disposed at an upper left side of the pixel. When in the reference pixel, the red sub pixel SR is disposed on a straight line in the y-axis direction which is the same as the green sub pixel at an upper left side, the blue sub pixel SB is disposed at a right center of the pixel. In a pixel which is adjacent to the reference pixel in the y-axis direction, the red sub pixel SR is disposed at the right center and the blue sub pixel SB is disposed on a straight line in the y-axis direction which is the same as the green sub pixel SG at an upper left side.

When the sub pixels are disposed as illustrated in FIG. 12, referring to FIG. 9, the first driving transistor 920 is connected to every green sub pixel and the second driving transistor 960 is simultaneously connected to two red sub pixels SR between two pixels which are adjacent in the x-axis direction. The third driving transistor 970 is also simultaneously connected to two blue sub pixels SB between two pixels which are adjacent in the x-axis direction.

In the organic light emitting display device 1200 according to another example embodiment of the present disclosure, even though each of the green sub pixel SG, the red sub pixel SR, and the blue sub pixel SB is partially regularly disposed, sub pixels which emit a same color light are disposed to be sufficiently spaced apart from each other. Therefore, stress which is applied to the aperture area of the FMM during a deposition process using the FMM may be distributed and the deformation of the FMM may be minimized, thereby improving precision of the deposition. Further, as the deformation of the FMM is minimized, the problem that the organic light emitting layers which are deposited through the FMM overlap may be reduced. Further, a color mixture problem of the organic light emitting layer due to the overlapping of the organic light emitting layers may be minimized.

Figure 13:
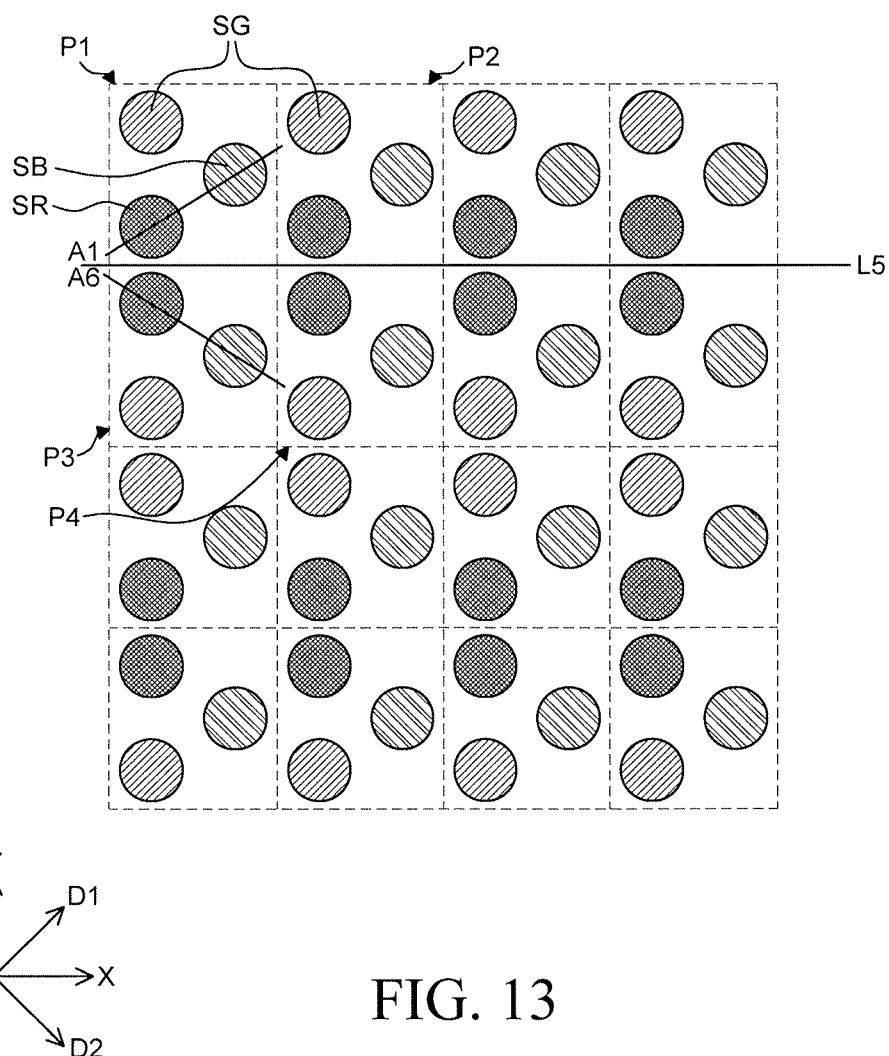
FIG. 13 is a schematic plan view illustrating an organic light emitting display device according to another example embodiment of the present disclosure.

FIG. 13 is a schematic plan view illustrating an organic light emitting display device according to another example embodiment of the present disclosure. The organic light emitting display device 1300 illustrated in FIG. 13 has the substantially same configuration as the organic light emitting display device 900 illustrated in FIG. 9 except the arrangement position and arrangement relationship of the sub pixels. Therefore, the redundant description thereof will be omitted or will be briefly made below.

Referring to FIG. 13, each of a plurality of pixels includes a green sub pixel SG, a red sub pixel SR, and a blue sub pixel SB. In detail, the arrangement of sub pixels in the first pixel P1 is the same as the arrangement of sub pixels in the second pixel P2 and the arrangement of sub pixels in the third pixel P3 is the same as the arrangement of sub pixels in the fourth pixel P4. Therefore, the arrangement of the sub pixels in the first pixel P1 may be symmetrical to the arrangement of the sub pixels in the third pixel P3 with respect to a fifth straight line L5 which extends in a boundary line between the first pixel P1 and the third pixel P3. For example, in the first pixel P1 illustrated in FIG. 13, the red sub pixel SR and the blue sub pixel SB are disposed on a first diagonal line A1 extending in the third direction. Further, in the third pixel P3, the red sub pixel SR and the blue sub pixel SB are disposed on the sixth diagonal line A6 extending in the fourth direction.

In other words, in the pixel which is adjacent to each other in the x-axis direction in one reference pixel, the green sub pixel SG and the blue sub pixel SB are disposed by switching the positions of the green sub pixel SG and blue sub pixel SB which are disposed in the reference pixel. The red sub pixel SR is connected to one driving transistor between pixels which are adjacent to each other in the y-axis direction and the blue sub pixel SB is also connected to one driving transistor between pixels which are adjacent to each other in the y-axis direction.

Referring to FIG. 13, the green sub pixel SG, the red sub pixel SR, and the blue sub pixel SB may be disposed to be symmetrical to each other with respect to a straight line which is parallel to the x-axis direction, between one reference pixel and a pixel which is adjacent to one reference pixel in the y-axis direction.

In the organic light emitting display device 1300 according to another exemplary embodiment of the present disclosure, even though each of the green sub pixel SG, the red sub pixel SR, and the blue sub pixel SB are partially regularly disposed, sub pixels which emit a same color light are disposed to be sufficiently spaced apart from each other. Therefore, stress which is applied to the aperture area of the FMM during a deposition process using the FMM may be distributed and the deformation of the FMM may be minimized, thereby improving precision of the deposition. Further, as the deformation of the FMM is minimized, the problem that the organic light emitting layers which are deposited through the FMM overlap may be reduced. Further, a color mixture problem of the organic light emitting layer due to the overlapping of the organic light emitting layers may be minimized.

Figure 14:
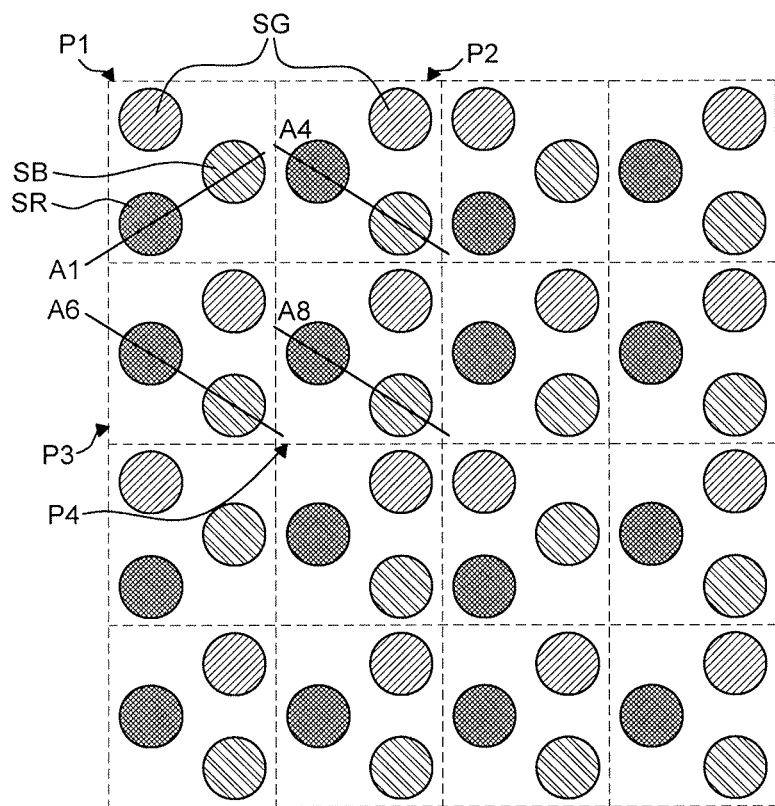
FIG. 14 is a schematic plan view illustrating an organic light emitting display device according to another example embodiment of the present disclosure.

FIG. 14 is a schematic plan view illustrating an organic light emitting display device according to another exampleembodiment of the present disclosure. The organic light emitting display device 1400 illustrated in FIG. 14 has the substantially same configuration as the organic light emitting display device 900 illustrated in FIG. 9 except the arrangement position and relationship of the sub pixels. Therefore, the redundant description thereof will be omitted or will be briefly made below.

Referring to FIG. 14, the arrangement of sub pixels in a second pixel P2 is the same as the arrangement of sub pixels in a fourth pixel P4 and the arrangement of sub pixels in a second pixel P2 is the same as the arrangement of sub pixels in a third pixel P3. In the first pixel P1, the red sub pixel SR and the blue sub pixel SB are disposed on a first diagonal line A1 extending in the third direction. In the second pixel P2, the red sub pixel SR and the blue sub pixel SB are disposed on a fourth diagonal line A4 extending in the fourth direction. Further, in the third pixel P3, the red sub pixel SR and the blue sub pixel SB are disposed on a sixth diagonal line A6 extending in the fourth direction. Further, in the fourth pixel P4, the red sub pixel SR and the blue sub pixel SB are disposed on the eighth diagonal line A8 extending in the fourth direction.

For example, in one pixel, the green sub pixel SG is disposed at an upper portion of the pixel. When the green sub pixel SG is disposed at an upper left side of the reference pixel, in the remaining pixel which is adjacent to the reference pixel, the green sub pixel SG is disposed at an upper right side of the pixel. In all pixels, the red sub pixels SR are disposed at a left side and the blue sub pixels SB are disposed at a right side. Further, in another pixel which is adjacent to the reference pixel, the red sub pixel SR is disposed at a left center of the pixel and the blue sub pixel SB is disposed at a lower right side.

In the organic light emitting display device 1400 according to another exemplary embodiment of the present disclosure, even though each of the green sub pixel SG, the red sub pixel SR, and the blue sub pixel SB are partially regularly disposed, sub pixels which emit a same color light are disposed to be sufficiently spaced apart from each other. Therefore, stress which is applied to the aperture area of the FMM during a deposition process using the FMM may be distributed and the deformation of the FMM may be minimized, thereby improving precision of the deposition. Further, as the deformation of the FMM is minimized, the problem that the organic light emitting layers which are deposited through the FMM overlap may be reduced. Further, a color mixture problem of the organic light emitting layer due to the overlapping of the organic light emitting layers may be minimized.

Figure 15:
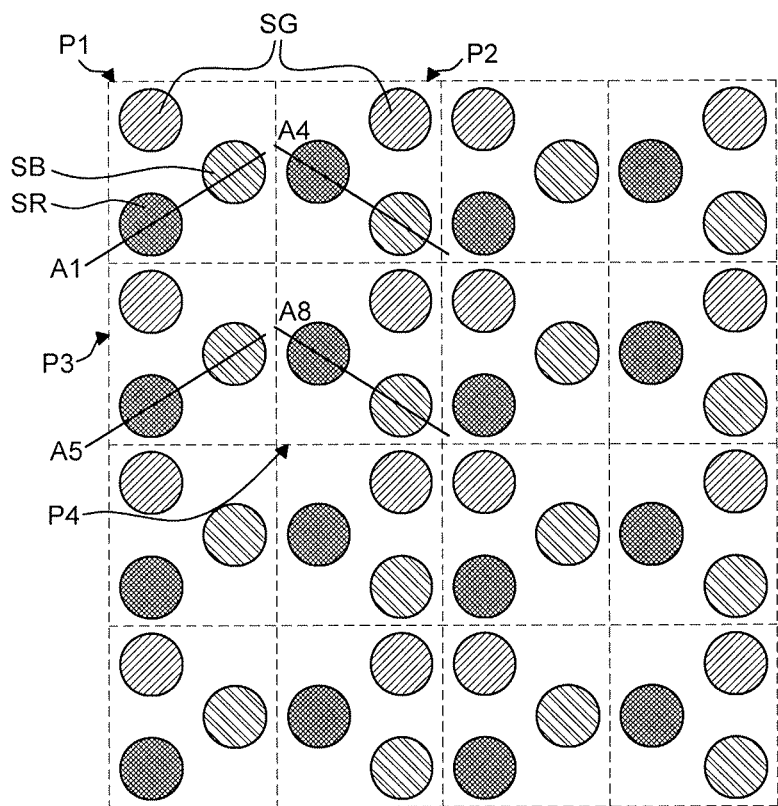
FIG. 15 is a schematic plan view illustrating an organic light emitting display device according to another exemplary embodiment of the present disclosure.

FIG. 15 is a schematic plan view illustrating an organic light emitting display device according to another example embodiment of the present disclosure. The organic light emitting display device 1500 illustrated in FIG. 15 has the substantially same configuration as the organic light emitting display device 900 illustrated in FIG. 9 except the arrangement position and relationship of the sub pixels. Therefore, the redundant description thereof will be omitted or will be briefly made below.

Referring to FIG. 15, the arrangement of the sub pixels in the second pixel P2 is the same as the arrangement of the sub pixels in the fourth pixel P4. In the first pixel P1, the red sub pixel SR and the blue sub pixel SB are disposed on a first diagonal line A1 extending in the third direction. In the second pixel P2, the red sub pixel SR and the blue sub pixel SB are disposed on a fourth diagonal line A4 extending in the fourth direction. Further, in the third pixel P3, the red sub pixel SR and the blue sub pixel SB are disposed on the fifth diagonal line A5 extending in the third direction. Furthermore, in the fourth pixel P4, the red sub pixel SR and the blue sub pixel SB are disposed on the eighth diagonal line A8 extending in the fourth direction.

For example, in one pixel, the green sub pixel SG is disposed at an upper portion of the pixel. When the green sub pixel SG is disposed at an upper left side of the pixel, in a pixel which is adjacent in the x-axis direction, the green sub pixel SG is symmetrically disposed at an upper right side of the pixel. When the blue sub pixel SB is disposed at a right center of the pixel, in a pixel which is adjacent in the x-axis direction, the blue sub pixel SB is disposed at a lower right side of the pixel. When the red sub pixel SR is disposed at a lower left side of the pixel, in a pixel which is adjacent in the x-axis direction, the red sub pixel SR is disposed at a left center of the pixel.

In the organic light emitting display device 1500 according to another example embodiment of the present disclosure, even though each of the green sub pixel SG, the red sub pixel SR, and the blue sub pixel SB is partially regularly arranged, sub pixels which emit a same color light are arranged to be sufficiently spaced apart from each other. Therefore, stress which is applied to the aperture area of the FMM during a deposition process using the FMM may be distributed and the deformation of the FMM may be minimized, thereby improving precision of the deposition. Further, as the deformation of the FMM is minimized, the problem that the organic light emitting layers which are deposited through the FMM overlap may be reduced. Further, a color mixture problem of the organic light emitting layer due to the overlapping of the organic light emitting layers may be minimized.

Figure 16:
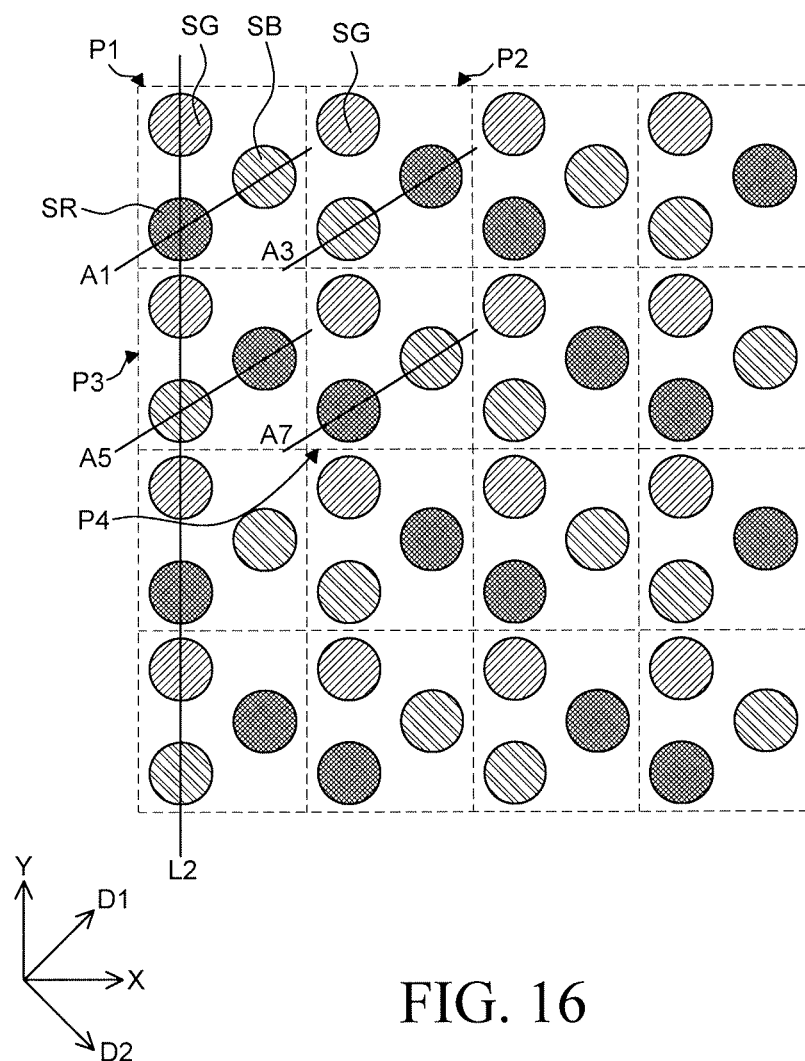
FIG. 16 is a schematic plan view illustrating an organic light emitting display device according to another example embodiment of the present disclosure.

FIG. 16 is a schematic plan view illustrating an organic light emitting display device according to another example embodiment of the present disclosure. The organic light emitting display device 1600 illustrated in FIG. 16 has the substantially same configuration as the organic light emitting display device 900 illustrated in FIG. 9 except the arrangement position and relationship of the sub pixels. Therefore, the redundant description thereof will be omitted or will be briefly made below.

Referring to FIG. 16, the arrangement of sub pixels in a first pixel P1 is the same as the arrangement of sub pixels in a fourth pixel P4 and the arrangement of sub pixels in a second pixel P2 is the same as the arrangement of sub pixels in a third pixel P3. In detail, in the first pixel P1, the red sub pixel SR and the blue sub pixel SB are disposed on a first diagonal line A1 extending in the third direction. In the second pixel P2, the red sub pixel SR and the blue sub pixel SB are disposed on a third diagonal line A3 extending in the third direction. Further, in the third pixel P3, the red sub pixel SR and the blue sub pixel SB are disposed on a fifth diagonal line A5 extending in the third direction. In the fourth pixel P4, the red sub pixel SR and the blue sub pixel SB are disposed on a seventh diagonal line A7 extending in the third direction. Further, a straight line connecting a center of the red sub pixel SR of the first pixel P1 and a center of the red sub pixel SR of the third pixel P3 intersects the second straight line L2 extending in the second direction.

For example, in one pixel, the green sub pixel SG is disposed at an upper left side of the pixel. When the red sub pixel SR is disposed at a lower left side and the blue sub pixel SB is disposed at a right center in the reference pixel, in the pixel which is adjacent in the y-axis direction, the blue sub pixel SB is disposed in the lower left side and the red sub pixel SR is disposed in the right center. In the pixels which are adjacent each other in the diagonal line in each pixel, the arrangement of the sub pixels is same.

In the organic light emitting display device 1600 according to another exemplary embodiment of the present disclosure, even though each of the green sub pixel SG, the red sub pixel SR, and the blue sub pixel SB is partially regularly arranged, sub pixels which emit a same color light are arranged to be sufficiently spaced apart from each other. Therefore, stress which is applied to the aperture area of the FMM during a deposition process using the FMM may be distributed and the deformation of the FMM may be minimized, thereby improving precision of the deposition. Further, as the deformation of the FMM is minimized, the problem in that the organic light emitting layers which are deposited through the FMM overlap may be reduced. Further, a color mixture problem of the organic light emitting layer due to the overlapping of the organic light emitting layers may be minimized.

Figure 17:
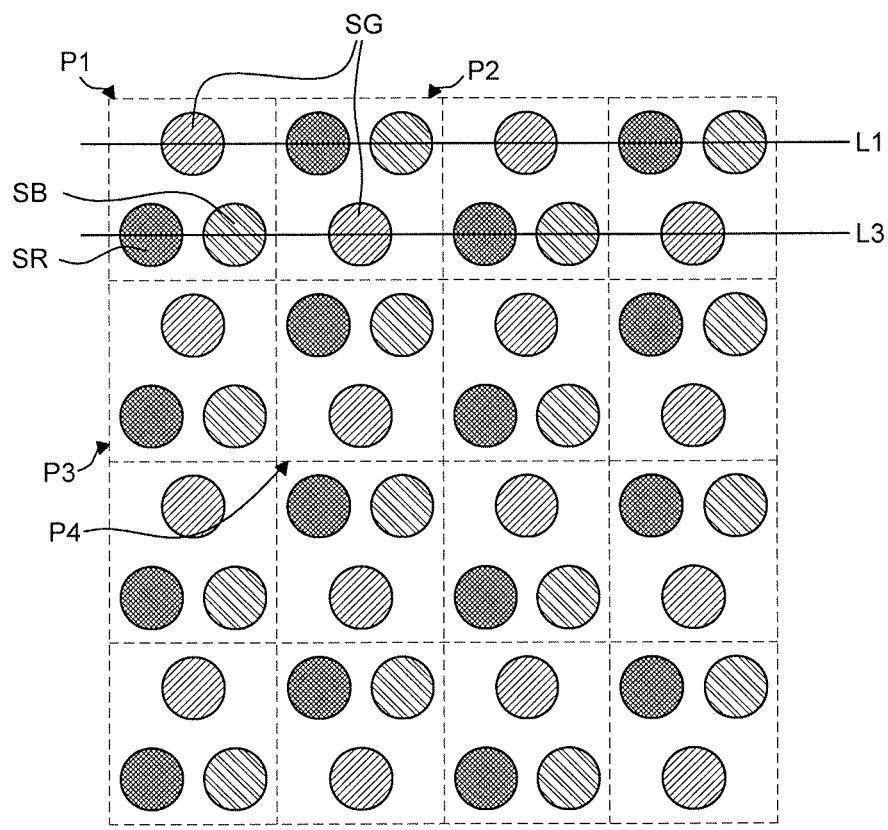
FIG. 17 is a schematic plan view illustrating an organic light emitting display device according to another example embodiment of the present disclosure.

FIG. 17 is a schematic plan view illustrating an organic light emitting display device according to another example embodiment of the present disclosure. The organic light emitting display device 1700 illustrated in FIG. 17 has the substantially same configuration as the organic light emitting display device 900 illustrated in FIG. 9 except the arrangement position of the sub pixels. Therefore, the redundant description thereof will be omitted or will be briefly made below. Further, even though the driving transistor and the connection relationship between the sub pixel and the driving transistor are not illustrated in FIG. 17, referring to FIG. 9, the first driving transistor 920 is connected to the green sub pixel SG Further, the second driving transistor 960 are simultaneously connected to the red sub pixel SR in one reference pixel and a red sub pixel SR in a pixel which is adjacent to the reference pixel in the x-direction. Similarly, the third driving transistor 970 is simultaneously connected to a blue sub pixel SB of one reference pixel and a blue sub pixel SB in a pixel which is adjacent to the reference pixel in the x-axis direction.

Referring to FIG. 17, the arrangement of sub pixels in a first pixel P1 is the same as the arrangement of sub pixels in a third pixel P3 and the arrangement of sub pixels in a second pixel P2 is the same as the arrangement of sub pixels in a fourth pixel P4. Further, the green sub pixel in the first pixel P1 and the red sub pixel SR and the blue sub pixel SB in the second pixel P2 are disposed on a first straight line L1 extending in the first direction. The red sub pixel SR and the blue sub pixel SB in the first pixel P1 and the green sub pixel in the second pixel P2 are disposed on a third straight line L3 extending in the first direction. Further, the arrangement of sub pixels in the first pixel P1 is asymmetrical to the arrangement of sub pixels in the fourth pixel P4 and the arrangement of sub pixels in the second pixel P2 is asymmetrical to the arrangement of sub pixels in the third pixel P3.

For example, in one pixel, the green sub pixel SG is disposed at an upper center or a lower center of the pixel. The red sub pixel SR is disposed in the upper left side or the lower left side in one pixel. The blue sub pixel SB may be disposed at an upper right side or a lower right side in one pixel.

Further, in one reference pixel, when the green sub pixel SG is disposed at an upper center of the reference pixel with respect to a straight line which is parallel to the x-axis and passes through a center of the pixel, in the pixel adjacent to the reference pixel, the green sub pixel SG is disposed in a lower center with respect to the straight line which is parallel to the x-axis and passes through the center of the pixel. Similarly, in one reference pixel, when the red sub pixel SR is disposed at a lower left side of the reference pixel with respect to a straight line which is parallel to the x-axis and passes through a center of the pixel, in the pixel adjacent to the reference pixel, the red sub pixel SR is disposed in an upper left side with respect to the straight line which is parallel to the x-axis and passes through the center of the pixel. Similarly, in one reference pixel, when the blue sub pixel SB is disposed at a lower right side of the reference pixel with respect to a straight line which is parallel to the x-axis and passes through a center of the pixel, in the pixel adjacent to the reference pixel, the blue sub pixel SB is disposed in an upper right side with respect to the straight line which is parallel to the x-axis and passes through the center of the pixel.

Further, between two pixels which are adjacent to each other in the y-axis direction, the green sub pixel SG, the red sub pixel SR, and the blue sub pixel SB may be disposed in the same position in each pixel.

In the organic light emitting display device 1700 according to another example embodiment of the present disclosure, sub pixels which emit the same color light are arranged to be sufficiently spaced apart from each other. In detail, each of the green sub pixel SG, the red sub pixel SR, and the blue sub pixel SB may be spaced apart from each other with a distance corresponding to at least one pixel size or one pixel size or more. Therefore, stress which is applied to the aperture area of the FMM during a deposition process using the FMM may be distributed and the deformation of the FMM may be minimized, thereby improving precision of the deposition. Further, as the deformation of the FMM is minimized, the problem that the organic light emitting layers which are deposited through the FMM overlap may be reduced. Further, a color mixture problem of the organic light emitting layer due to the overlapping of the organic light emitting layers may be minimized.

Figure 18:
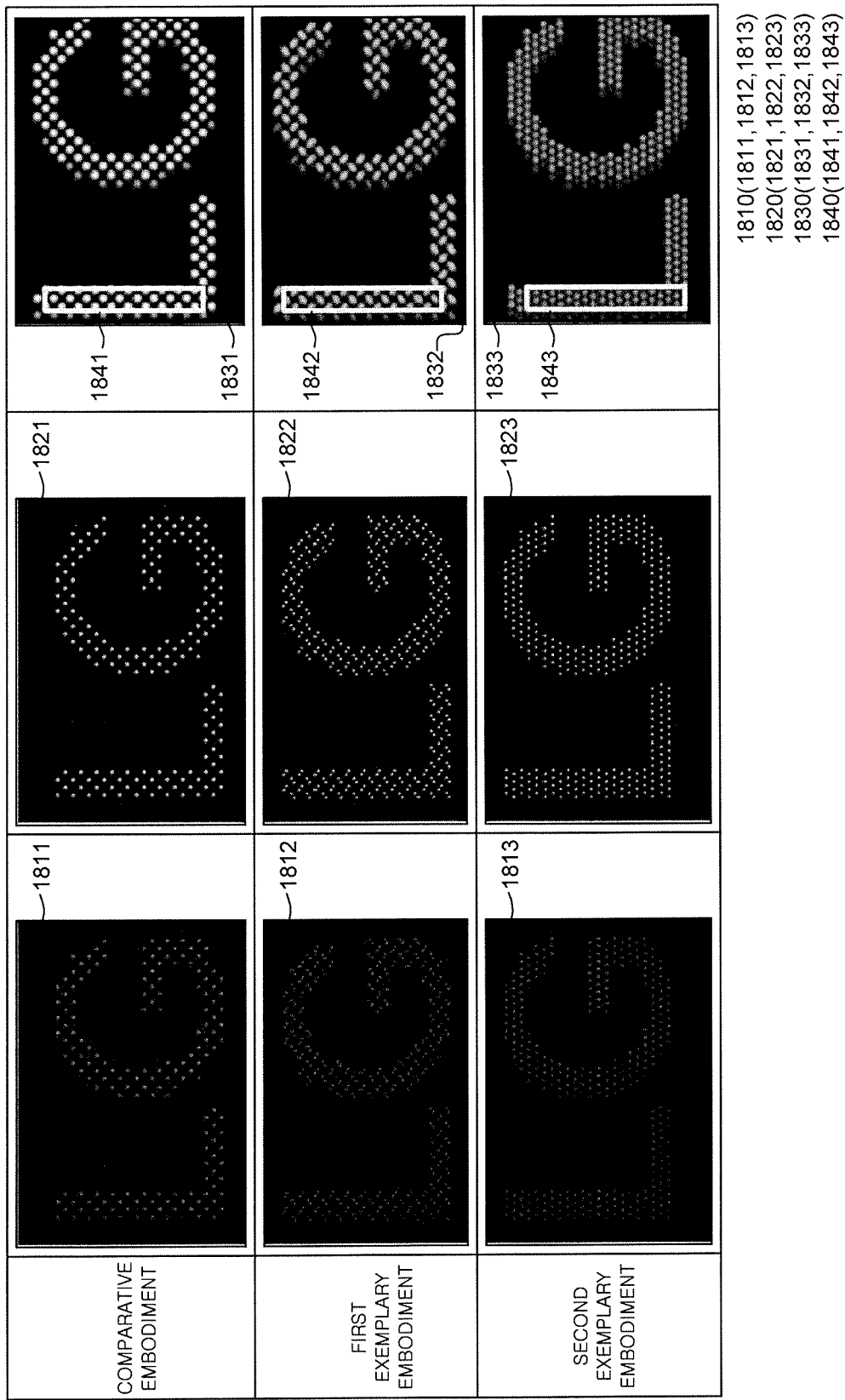
FIG. 18 is an exemplary plan view illustrating an effect according to a comparative embodiment and example embodiments of the present disclosure.

FIG. 18 is an example plan view illustrating an effect according to a comparative embodiment and example embodiments of the present disclosure.

FIG. 18 illustrates a screen generated when only one of red light, green light, and blue light is emitted according to a comparative example, the first example embodiment, and the second example embodiment. Here, according to the comparative embodiment, an organic light emitting display device includes a configuration of a pixel in which one pixel includes two sub pixels and one of two sub pixels is a green sub pixel. According to the first example embodiment, an organic light emitting display device includes a configuration of a pixel in which three sub pixels are disposed in one pixel to form a triangle as illustrated in FIG. 1 and two sub pixels are red sub pixels or blue sub pixels. According to the second example embodiment, an organic light emitting display device includes a configuration of a pixel in which a green sub pixel, a red sub pixel, and a blue sub pixel are disposed in one pixel to form a triangle, as illustrated in FIG. 9.

Further, in FIG. 18, an original image 1810, an image 1820 which is converted into a gray scale and an image 1830 in which a Gaussian distribution is convoluted are illustrated. The original image 1810 is an example screen on which only one of red light, green light, and blue light is emitted by the organic light emitting display device according to the comparative example and the example embodiment. The original image 1810 includes an original image 1811 according to the comparative example, an original image 1812 according to the first example embodiment, and an original image 1813 according to the second exampleembodiment. Similarly, the image 1820 which is converted into the gray scale is an example screen obtained by converting the original image 1810 into a gray scale. The image 1820 which is converted into the gray scale includes an image 1821 which is converted into a gray scale according to the comparative example, an image 1822 which is converted into a gray scale according to the first example embodiment, and an image 1823 which is converted into a gray scale according to the second example embodiment. The image 1830 in which the Gaussian distribution is convoluted is an example screen illustrating a result of convoluting the image 1820 which is converted into the gray scale using a Gaussian distribution for every pixel. The image 1830 in which the Gaussian distribution is convoluted includes an image 1831 in which the Gaussian distribution is convoluted according to the comparative example, an image 1832 in which the Gaussian distribution is convoluted according to the first example embodiment, and an image 1833 in which the Gaussian distribution is convoluted according to the second example embodiment.

Further, in FIG. 18, when the image 1830 in which the Gaussian distribution is convoluted is referred to, an area between the emission areas of the sub pixel which is visibly recognized as black is broad, so that a cognitive fill factor is substantially very low.

Here, the cognitive fill factor refers to a ratio of an area which is recognized by a user who uses the display device as an emission area in an actual pixel, which is different from an aperture ratio by the aperture area of the sub pixel. Therefore, as the cognitive fill factor is improved, an area which is actually recognized by the user is increased. Therefore, the user may recognize an image having a high resolution.

And, when the image 1832 in which the Gaussian distribution is convoluted according to the first example embodiment and the image 1833 in which the Gaussian distribution is convoluted according to the second example embodiment are compared with the image 1831 in which the Gaussian distribution is convoluted according to the comparative example, the organic light emitting display device according to the exemplary embodiments of the present disclosure include emission areas of sub pixels which are more closely disposed as compared with the organic light emitting display device according to the comparative example. That is, it is understood that the cognitive fill factor of the organic light emitting display device according to the first and second example embodiments of the present disclosure is significantly improved as compared with the comparative example.

As illustrated in FIG. 18, it is difficult to evaluate a lattice artifact only using the original image 1810. When the Gaussian distribution for every pixel is used, a human visual characteristic may be more easily described. Furthermore, the result obtained by convoluting the Gaussian distribution for every pixel may represent an image recognized by human. Therefore, the original image 1810 is converted into the gray scale and the image 1830 which is convoluted by applying the Gaussian distribution for every pixel to the image 1820 which is converted into the gray scale is used to easily evaluate the lattice artifact.

In detail, a determination area 1840 in the image 1830 in which the Gaussian distribution is convoluted is set so as to easily and quantatively evaluate the lattice artifact. The determination area 1840 includes a determination area 1841 according to the comparative example, a determination area 1842 according to the first example embodiment, and a determination area 1843 according to the second example embodiment. The determination area 1840 may be determined in various manners to be an area including arbitrary pixels in the image 1830 in which the Gaussian distribution is convoluted. Hereinafter, a result of evaluating a lattice artifact based on the determination area 1840 will be described.

FIG. 19 is a table including numerical values representing an effect according to a comparative example and example embodiments of the present disclosure. For the convenience of description, the effects will be described below also with reference to FIG. 18.

FIG. 19 illustrates averages of the comparative example, the first example embodiment, and the second example embodiment and deviations of the comparative example, the first example embodiment, and the second example embodiment. Here, the average indicates an average brightness of the pixels in the determination area 1840. When the average is high, the brightness in the determination area 1840 is significantly different from a brightness in a surrounding area which does not emit light so that the lattice feeling is obviously represented. The deviations represent a difference of brightness and darkness between the pixels in the determination area 1840. Therefore, when the deviation is high, the difference of the brightness and the darkness between the pixels is large so that the lattice feeling may be obviously recognized. In contrast, when the deviation is low, the difference of the brightness and the darkness between the pixels is small, so that the lattice feeling may be less obviously recognized.

Referring to FIG. 19, an average of the comparative example is 84.4 and a deviation thereof is 69.4. As compared with the comparative example, an average of the first example embodiment is 80.8 and a deviation thereof is 44.5 and an average of the second example embodiment is 82.1 and a deviation thereof is 21.2. That is, the average of the comparative example is higher than the averages of the first example embodiment and the second example embodiment, so that in the comparative example, the lattice feeling may be definitely recognized as compared with the first and second example embodiments. Further, the deviation of the comparative example is significantly higher than those of the first and second example embodiments, so that in the first and second exemplary embodiments, the lattice feeling may be significantly reduced as compared with the comparative example.

The example embodiments of the present disclosure can also be described as follows:

According to an aspect of the present disclosure, an organic light emitting display device includes a plurality of pixels. Each of the plurality of pixels includes three sub pixels. The plurality of pixels include a first pixel having a green sub pixel and two red sub pixels, a second pixel having a green sub pixel and two blue sub pixels, the second pixel being adjacent to the first pixel in a first direction, a third pixel having a green sub pixel and two blue sub pixels, the third pixel being adjacent to the first pixel in a second direction, and a fourth pixel having a green sub pixel and two red sub pixels, is the fourth pixel being adjacent to the second pixel in the second direction. In the organic light emitting display device according to the example embodiment of the present disclosure, a sub pixel is asymmetrically arranged in pixels which are arranged in at least one direction, to reduce a lattice artifact due to the regular arrangement of the sub pixels.

In one or more example embodiments of the present disclosure, straight lines connecting centers of three sub pixels in each of the plurality of pixels may form a triangle.

In one or more example embodiments of the present disclosure, the green sub pixel of the first pixel and the green sub pixel of the second pixel may be disposed on a straight line extending in the first direction, a straight line connecting a center of the green sub pixel of the first pixel and a center of the green sub pixel of the third pixel may intersect a straight line extending in the second direction, the two red sub pixels in the first pixel and two blue sub pixels in the second pixel may be disposed on a diagonal line extending in a third direction, and the two blue sub pixels in the third pixel and two red sub pixels in the fourth pixel may be disposed on a diagonal line extending in a fourth direction.

In one or more example embodiments of the present disclosure, the green sub pixel of the first pixel and the green sub pixel of the third pixel which is adjacent to the first pixel in the second direction may be disposed on a straight line extending in the second direction, the two red sub pixels in the first pixel and the two blue sub pixels in the second pixel may be disposed on a diagonal line extending in a third direction, and arrangement of the sub pixels in the first pixel may be the same as arrangement of the sub pixels in the fourth pixel and arrangement of the sub pixels in the second pixel is the same as arrangement of the sub pixels in the third pixel.

In one or more example embodiments of the present disclosure, arrangement of the sub pixels in the third pixel may be the same as arrangement of the sub pixels in the second pixel, the two red sub pixels in the first pixel may be disposed on a diagonal line extending in a third direction, and the two red sub pixels in the fourth pixel may be disposed on a diagonal line extending in a fourth direction.

In one or more example embodiments of the present disclosure, a straight line connecting a center of the green sub pixel of the first pixel and a center of the green sub pixel of the third pixel may intersect a straight line extending in the second direction and the two blue sub pixels in the second pixel and the two blue sub pixels in the third pixel may be disposed on a diagonal line extending in the fourth direction.

In one or more example embodiments of the present disclosure, a straight line connecting a center of the green sub pixel of the second pixel and a center of the green sub pixel of the fourth pixel may intersect a straight line extending in the second direction, and the two blue sub pixels in the second pixel and the two blue sub pixels in the third pixel may be disposed on a diagonal line extending in the third direction.

In one or more example embodiments of the present disclosure, the green sub pixel, the red sub pixel, and the blue sub pixel may be spaced apart from each other and may be formed as a square.

In one or more example embodiments of the present disclosure, each of the plurality of pixels may include two driving transistors which control each sub pixel to emit light, and the two driving transistors may include a first driving transistor which is connected to the green sub pixel and a second driving transistor which is connected to the two red sub pixels or the two blue sub pixels to simultaneously emit light.

According to another aspect of the present disclosure, an organic light emitting display device includes a plurality of pixels. Each of the plurality of pixels has a green sub pixel, a red sub pixel, and a blue sub pixel. The plurality of pixels include a first pixel, a second pixel being adjacent to the first pixel in a first direction, a third pixel being adjacent to the first pixel in a second direction, and a fourth pixel being adjacent to the second pixel in the second direction. Each of the plurality of pixels includes two driving transistors which control each sub pixel to emit light. In the organic light emitting display device according to the example embodiment of the present disclosure, sub pixels are arranged to be separated in one pixel and the separated sub pixels are driven by one driving transistor. Therefore, a spacing between sub pixels which are recognized by the user may be reduced and a cognitive fill factor of the organic light emitting display device is improved.

In one or more example embodiments of the present disclosure, straight lines connecting centers of three sub pixels in each of the plurality of pixels may form a triangle.

In one or more example embodiments of the present disclosure, arrangement of the sub pixels in the first pixel may be the same as arrangement of the sub pixels in the second pixel and arrangement of the sub pixels in the third pixel may be the same as arrangement of the sub pixels in the fourth pixel, and the red sub pixel and the blue sub pixel in the first pixel may be disposed on a diagonal line extending in a third direction.

In one or more example embodiments of the present disclosure, the red sub pixel and the blue sub pixel in the third pixel may be disposed on a diagonal line extending in a fourth direction.

In one or more example embodiments of the present disclosure, the arrangement of the sub pixels in the first pixel may be symmetrical to the arrangement of the sub pixels in the third pixel with respect to a straight line extending a boundary line between the first pixel and the third pixel.

In one or more example embodiments of the present disclosure, the arrangement of the sub pixels in the first pixel may be the same as the arrangement of the sub pixels in the third pixel.

In one or more example embodiments of the present disclosure, the red sub pixel and the blue sub pixel in the third pixel may be disposed on a diagonal line extending in the third direction and a straight line connecting a center of the red sub pixel of the first pixel and a center of the red sub pixel of the third pixel may intersect a straight line extending in the second direction.

In one or more example embodiments of the present disclosure, arrangement of the sub pixels in the second pixel may be the same as arrangement of the sub pixels in the fourth pixel, the red sub pixel and the blue sub pixel in the first pixel may be disposed on a diagonal line extending in a third direction, and the red sub pixel and the blue sub pixel in the second pixel may be disposed on a diagonal line extending in a fourth direction.

In one or more example embodiments of the present disclosure, the red sub pixel and the blue sub pixel in the third pixel may be disposed on a diagonal line extending in the fourth direction.

In one or more example embodiments of the present disclosure, the red sub pixel and the blue sub pixel in the third pixel may be disposed on a diagonal line extending in the third direction.

In one or more example embodiment of the present disclosure, arrangement of the sub pixels in the first pixel may be the same as arrangement of the sub pixels in the third pixel and arrangement of the sub pixels in the second pixel may be the same as arrangement of the sub pixels in the fourth pixel, the green sub pixel in the first pixel and the red sub pixel and the blue sub pixel in the second pixel may be disposed on one straight line extending in the first direction, and the red sub pixel and the blue sub pixel in the first pixel and the green sub pixel in the second pixel may be disposed on the other straight line extending in the first direction.

In one or more example embodiments of the present disclosure, arrangement of the sub pixels in the first pixel may be the same as arrangement of the sub pixels in the fourth pixel and arrangement of the sub pixels in the second pixel may be the same as arrangement of the sub pixels in the third pixel.

In one or more example embodiments of the present disclosure, the red sub pixel and the blue sub pixel in the first pixel may be disposed on a diagonal line extending in a third direction and a straight line connecting a center of the red sub pixel of the first pixel and a center of the red sub pixel of the third pixel may intersect a straight line extending in the second direction.

In one or more example embodiments of the present disclosure, the two driving transistors may include a first driving transistor which is connected to the green sub pixels of the first pixel and the second pixel and a second driving transistor which is connected to the red sub pixel of the first pixel and the red sub pixel of the second pixel or connected to the blue sub pixel of the first pixel and the blue sub pixel of the second pixel.

In one or more example embodiments of the present disclosure, the two driving transistors may include a first driving transistor which is connected to the green sub pixels of the third pixel and the fourth pixel and a second driving transistor which is connected to the red sub pixel of the third pixel and the red sub pixel of the fourth pixel or connected to the blue sub pixel of the third pixel and the blue sub pixel of the fourth pixel.

According to another aspect of the present disclosure, an organic light emitting display device includes first and fourth pixels each including one green sub pixel and two red sub pixels, and second and third pixies each including one green sub pixel and two blue sub pixels. The second pixel is adjacent to the first pixel in a first direction, and the third pixel is adjacent to the first pixel in a second direction different from the first direction and the first to fourth pixels adjacent to each other are repeatedly arranged over a substrate in the first and second directions, respectively. Each pixel including three sub pixels is driven by two driving transistors.

Although the example embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
   a plurality of pixels, each pixel among the plurality of pixels having three sub pixels,
   wherein the plurality of pixels include:
   a first pixel having a first green sub pixel and two red sub pixels;
   a second pixel having a second green sub pixel and two blue sub pixels, the second pixel being adjacent to the first pixel in a first direction;
   a third pixel having a third green sub pixel and two blue sub pixels, the third pixel being adjacent to the first pixel in a second direction; and
   a fourth pixel having a fourth green sub pixel and two red sub pixels, the fourth pixel being adjacent to the second pixel in the second direction,
   wherein one of the first and third pixels includes a sub pixel having a different color than all sub pixels in another pixel among the second and fourth pixels, or one of the second and fourth pixels includes a sub pixel having a different color than all sub pixels in another pixel among the first and third pixels, and
   wherein the one of the first and third pixels or the one of the second and fourth pixels is a different pixel than the another pixel among the first, second, third and fourth pixels.

2. The organic light emitting display device according to claim 1, wherein straight lines connecting centers of the three sub pixels in each of the plurality of pixels form a triangle.

3. The organic light emitting display device according to claim 1, wherein the first green sub pixel of the first pixel and the second green sub pixel of the second pixel are disposed on a straight line extending in the first direction,
   a straight line connecting a center of the first green sub pixel of the first pixel and a center of the third green sub pixel of the third pixel intersects a straight line extending in the second direction,
   the two red sub pixels in the first pixel and the two blue sub pixels in the second pixel are disposed on a diagonal line extending in a third direction, and
   the two blue sub pixels in the third pixel and the two red sub pixels in the fourth pixel are disposed on a diagonal line extending in a fourth direction.

4. The organic light emitting display device according to claim 1, wherein the first green sub pixel of the first pixel and the third green sub pixel of the third pixel which is adjacent to the first pixel in the second direction are disposed on a straight line extending in the second direction,
   the two red sub pixels in the first pixel and the two blue sub pixels in the second pixel are disposed on a diagonal line extending in a third direction, and
   arrangement of the sub pixels in the first pixel is the same as arrangement of the sub pixels in the fourth pixel and arrangement of the sub pixels in the second pixel is the same as arrangement of the sub pixels in the third pixel.

5. The organic light emitting display device according to claim 1, wherein arrangement of the sub pixels in the third pixel is the same as arrangement of the sub pixels in the second pixel, and
   the two red sub pixels in the first pixel are disposed on a diagonal line extending in a third direction and the two red sub pixels in the fourth pixel are disposed on a diagonal line extending in a fourth direction.

6. The organic light emitting display device according to claim 5, wherein a straight line connecting a center of the first green sub pixel of the first pixel and a center of the third green sub pixel of the third pixel intersects a straight line extending in the second direction, and
   the two blue sub pixels in the second pixel and the two blue sub pixels in the third pixel are disposed on a diagonal line extending in the fourth direction.

7. The organic light emitting display device according to claim 5, wherein a straight line connecting a center of the second green sub pixel of the second pixel and a center of the fourth green sub pixel of the fourth pixel intersects a straight line extending in the second direction, and
   the two blue sub pixels in the second pixel and the two blue sub pixels in the third pixel are disposed on a diagonal line extending in the third direction.

8. The organic light emitting display device according to claim 1, wherein the three sub pixels are spaced apart from each other and are formed as a square.

9. The organic light emitting display device according to claim 1, wherein each of the plurality of pixels includes two driving transistors which control each sub pixel to emit light, and
   the two driving transistors include a first driving transistor which is connected to the green sub pixel and a second driving transistor which is connected to the two red sub pixels or the two blue sub pixels to simultaneously emit light.

10. An organic light emitting display device, comprising:
    a plurality of pixels, each pixel among of the plurality of pixels having three sub pixels,
    wherein the plurality of pixels include:
    a first pixel;
    a second pixel being adjacent to the first pixel in a first direction;
    a third pixel being adjacent to the first pixel in a second direction; and
    a fourth pixel being adjacent to the second pixel in the second direction, and
    wherein each pixel among the plurality of pixels includes two driving transistors which control the three sub pixels of the corresponding pixel to emit light,
    wherein one of the first and third pixels includes a sub pixel having a different color than all sub pixels in another pixel among the second and fourth pixels, or one of the second and fourth pixels includes a sub pixel having a different color than all sub pixels in another pixel among the first and third pixels, wherein the one of the first and third pixels or the one of the second and fourth pixels is a different pixel than the another pixel among the first, second; third and fourth pixels, and wherein straight lines connecting centers of the three sub pixels in each of the plurality of pixels form a triangle.

11. The organic light emitting display device according to claim 10, wherein arrangement of the sub pixels in the first pixel is the same as arrangement of the sub pixels in the second pixel and arrangement of the sub pixels in the third pixel is the same as arrangement of the sub pixels in the fourth pixel, and a red sub pixel and a blue sub pixel in the first pixel are disposed on a diagonal line extending in a third direction.

12. The organic light emitting display device according to claim 11, wherein a red sub pixel and a blue sub pixel in the third pixel are disposed on a diagonal line extending in a fourth direction.

13. The organic light emitting display device according to claim 12, wherein the arrangement of the sub pixels in the first pixel is symmetrical to the arrangement of the sub pixels in the third pixel with respect to a straight line extending in a boundary line between the first pixel and the third pixel.

14. The organic light emitting display device according to claim 11, wherein the arrangement of the sub pixels in the first pixel is the same as the arrangement of the sub pixels in the third pixel.

15. The organic light emitting display device according to claim 11, wherein a red sub pixel and a blue sub pixel in the third pixel are disposed on a diagonal line extending in the third direction, and a straight line connecting a center of the red sub pixel of the first pixel and a center of the red sub pixel of the third pixel intersects a straight line extending in the second direction.

16. The organic light emitting display device according to claim 10, wherein arrangement of the sub pixels in the second pixel is the same as arrangement of the sub pixels in the fourth pixel, a red sub pixel and a blue sub pixel in the first pixel are disposed on a diagonal line extending in a third direction, and a red sub pixel and a blue sub pixel in the second pixel are disposed on a diagonal line extending in a fourth direction.

17. The organic light emitting display device according to claim 16, wherein a red sub pixel and a blue sub pixel in the third pixel are disposed on a diagonal line extending in the fourth direction.

18. The organic light emitting display device according to claim 17, wherein the red sub pixel and the blue sub pixel in the third pixel are disposed on a diagonal line extending in the third direction.

19. The organic light emitting display device according to claim 10, wherein arrangement of the sub pixels in the first pixel is the same as arrangement of the sub pixels in the third pixel and arrangement of the sub pixels in the second pixel is the same as arrangement of the sub pixels in the fourth pixel, a green sub pixel in the first pixel and a red sub pixel and a blue sub pixel in the second pixel are disposed on one straight line extending in the first direction, and a red sub pixel and a blue sub pixel in the first pixel and a green sub pixel in the second pixel are disposed on the other straight line extending in the first direction.

20. The organic light emitting display device according to claim 10, wherein arrangement of the sub pixels in the first pixel is the same as arrangement of the sub pixels in the fourth pixel and arrangement of the sub pixels in the second pixel is the same as arrangement of the sub pixels in the third pixel.

21. The organic light emitting display device according to claim 20, wherein a red sub pixel and a blue sub pixel in the first pixel are disposed on a diagonal line extending in a third direction, and a straight line connecting a center of the red sub pixel of the first pixel and a center of a red sub pixel of the third pixel intersects a straight line extending in the second direction.

22. The organic light emitting display device according to claim 10, wherein the two driving transistors include a first driving transistor which is connected to green sub pixels of the first pixel and the second pixel and a second driving transistor which is connected to a red sub pixel of the first pixel and a red sub pixel of the second pixel or connected to a blue sub pixel of the first pixel and a blue sub pixel of the second pixel.

23. The organic light emitting display device according to claim 10, wherein the two driving transistors include a first driving transistor which is connected to green sub pixels of the third pixel and the fourth pixel and a second driving transistor which is connected to a red sub pixel of the third pixel and a red sub pixel of the fourth pixel or connected to a blue sub pixel of the third pixel and a blue sub pixel of the fourth pixel.

24. An organic light emitting display device, comprising:

first and fourth pixels each including one green sub pixel and two red sub pixels; and second and third pixels each including one green sub pixel and two blue sub pixels, wherein the second pixel is adjacent to the first pixel in a first direction, and the third pixel is adjacent to the first pixel in a second direction different from the first direction, wherein the first to fourth pixels adjacent to each other are repeatedly arranged over a substrate in the first and second directions, respectively, wherein each pixel including three sub pixels is driven by two driving transistors, and wherein one of the first and third pixels includes a sub pixel having a different color than all sub pixels in another pixel among the second and fourth pixels, or one of the second and fourth pixels includes a sub pixel having a different color than all sub pixels in another pixel among the first and third pixels, and wherein the one of the first and third pixels or the one of the second and fourth pixels is a different pixel than the another pixel among the first, second, third and fourth pixels.

* * * * *